US012476592B2

(12) United States Patent
Takenaka

(10) Patent No.: US 12,476,592 B2
(45) Date of Patent: Nov. 18, 2025

(54) POWER AMPLIFIER

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 879 days.

(21) Appl. No.: 16/953,890

(22) Filed: Nov. 20, 2020

(65) Prior Publication Data

US 2021/0175853 A1 Jun. 10, 2021

(30) Foreign Application Priority Data

Dec. 10, 2019 (JP) ................................ 2019-223209
Aug. 6, 2020 (JP) ................................ 2020-133611

(51) Int. Cl.
H03F 1/02 (2006.01)
H01P 5/16 (2006.01)
H03F 3/21 (2006.01)

(52) U.S. Cl.
CPC ............. H03F 1/0288 (2013.01); H01P 5/16 (2013.01); H03F 3/211 (2013.01); H03F 2200/372 (2013.01); H03F 2200/451 (2013.01)

(58) Field of Classification Search
CPC .. H03F 1/0288; H03F 3/211; H03F 2200/372; H03F 2200/451; H01P 5/16

(Continued)

(56) References Cited

U.S. PATENT DOCUMENTS 1,823,851 A * 9/1931 Barone .................... H03B 5/10
315/138
2006/0141979 A1 6/2006 Liu et al.
(Continued)

FOREIGN PATENT DOCUMENTS

JP H10335912 A 12/1998
JP 2001185919 A 7/2001
(Continued)

OTHER PUBLICATIONS

George Slade, "The Basics of the Doherty Amplifier", Orban Microwave Products, Aug. 2011, www.orbanmicrowave.com. (Year: 2011).*

(Continued)

Primary Examiner — Hafizur Rahman
(74) Attorney, Agent, or Firm — McDonald Hopkins LLC

(57) ABSTRACT

A power amplifier includes a 3-dB coupler which splits a first signal into a second signal and a third signal lagging behind the second signal by 90°, a carrier amplifier, a peak amplifier, and a hybrid coupler. The carrier amplifier amplifies the second signal and outputs a fourth signal when the first-signal power level is a first level or higher. The peak amplifier amplifies the third signal and outputs a fifth signal when the first-signal power level is a second level or higher, which is higher than the first level. The hybrid coupler includes a first transmission line receiving the fourth signal at its first terminal, and a second transmission line receiving the fifth signal at its first terminal and being open at its second terminal. The first transmission line outputs, from its second terminal, an amplified first signal obtained by combining the fourth and fifth signals.

1 Claim, 29 Drawing Sheets

(58) Field of Classification Search
USPC .......................................................... 330/295
See application file for complete search history.

(56) References Cited

U.S. PATENT DOCUMENTS

| | | | | |
|---|---|---|---|---|
| 2008/0074735 | A1* | 3/2008 | Bakalski | H03F 1/0277 |
| | | | | 359/337.4 |
| 2016/0013761 | A1 | 1/2016 | Takenaka | |
| 2016/0218693 | A1* | 7/2016 | Lyalin | H03F 3/211 |
| 2020/0195200 | A1* | 6/2020 | Wang | H03F 1/56 |

FOREIGN PATENT DOCUMENTS

| | | | |
|---|---|---|---|
| JP | 2007134994 A | | 5/2007 |
| JP | 2008526106 A | | 7/2008 |
| JP | 2009303040 A | | 12/2009 |
| JP | 2012209757 A | | 10/2012 |
| JP | 2016019228 A | | 2/2016 |

OTHER PUBLICATIONS

Charles F. Campell, A Fully Integrated Ku-Band Doherty Amplifier MMIC, IEEE Microwave and Guided Wave Letters, vol. 9, No. 3, Mar. 1999, pp. 114-116.

* cited by examiner

POWER AMPLIFIER

CROSS REFERENCE TO RELATED APPLICATIONS

This application claims priority from Japanese Patent Application No. 2019-223209 filed on Dec. 10, 2019, and claims priority from Japanese Patent Application No. 2020-133611 filed on Aug. 6, 2020. The contents of these applications are incorporated herein by reference in their entireties.

BACKGROUND

The present disclosure relates to a power amplifier.

Doherty amplifiers are known as highly efficient power amplifier circuits. A typical Doherty amplifier includes a carrier amplifier and a peak amplifier which are connected in parallel. The carrier amplifier operates regardless of the power level of an input signal. The peak amplifier is switched off when the power level of an input signal is low, and is switched on when the power level of the input signal is high. When the power level of an input signal is high, the carrier amplifier operates while maintaining saturation at the saturated output power level. Doherty amplifiers may improve the efficiency compared with typical power amplifier circuits.

For example, Japanese Unexamined Patent Application Publication No. 2016-19228 discloses a Doherty amplifier, as a modified example of Doherty amplifier, which does not include λ/4 lines used in a typical Doherty amplifier.

In the Doherty amplifier disclosed in Japanese Unexamined Patent Application Publication No. 2016-19228, a signal from the carrier amplifier goes through an inductor, and merges with a signal from the peak amplifier. When the amplified frequency is 3 GHz or higher, the inductance of the inductor needs to be made small, resulting in a reduction in the size of the inductor. A small inductor is susceptible to influence from the parasitic component. In this case, amplification for obtaining desired characteristics is difficult to achieve due to influence from the parasitic component.

BRIEF SUMMARY

The present disclosure provides a Doherty amplifier which achieves high efficiency and a reduction in size and which reduces influence from the parasitic component.

A power amplifier according to one aspect the present disclosure includes a splitter, a first amplifier, a second amplifier, and a hybrid coupler. The splitter splits a first signal into a second signal and a third signal which lags behind the second signal by 90°. The first amplifier amplifies the second signal and outputs a fourth signal in a range in which a power level of the first signal is equal to or higher than a first level. The second amplifier amplifies the third signal and outputs a fifth signal in a range in which the power level of the first signal is equal to or higher than a second level. The second level is higher than the first level. The hybrid coupler includes a first transmission line and a second transmission line. The first transmission line receives the fourth signal at its first terminal. The second transmission line receives the fifth signal at its first terminal. The second transmission line is open at its second terminal. The first transmission line outputs, from its second terminal, an amplified signal of the first signal. The amplified signal is obtained by combining the fourth signal with the fifth signal.

Other features, elements, characteristics and advantages of the present disclosure will become more apparent from the following detailed description of embodiments of the present disclosure with reference to the attached drawings.

According to the present disclosure, it is provided a Doherty amplifier which achieves high efficiency and a reduction in size and which reduces influence from the parasitic component.

DETAILED DESCRIPTION

Figure 1:
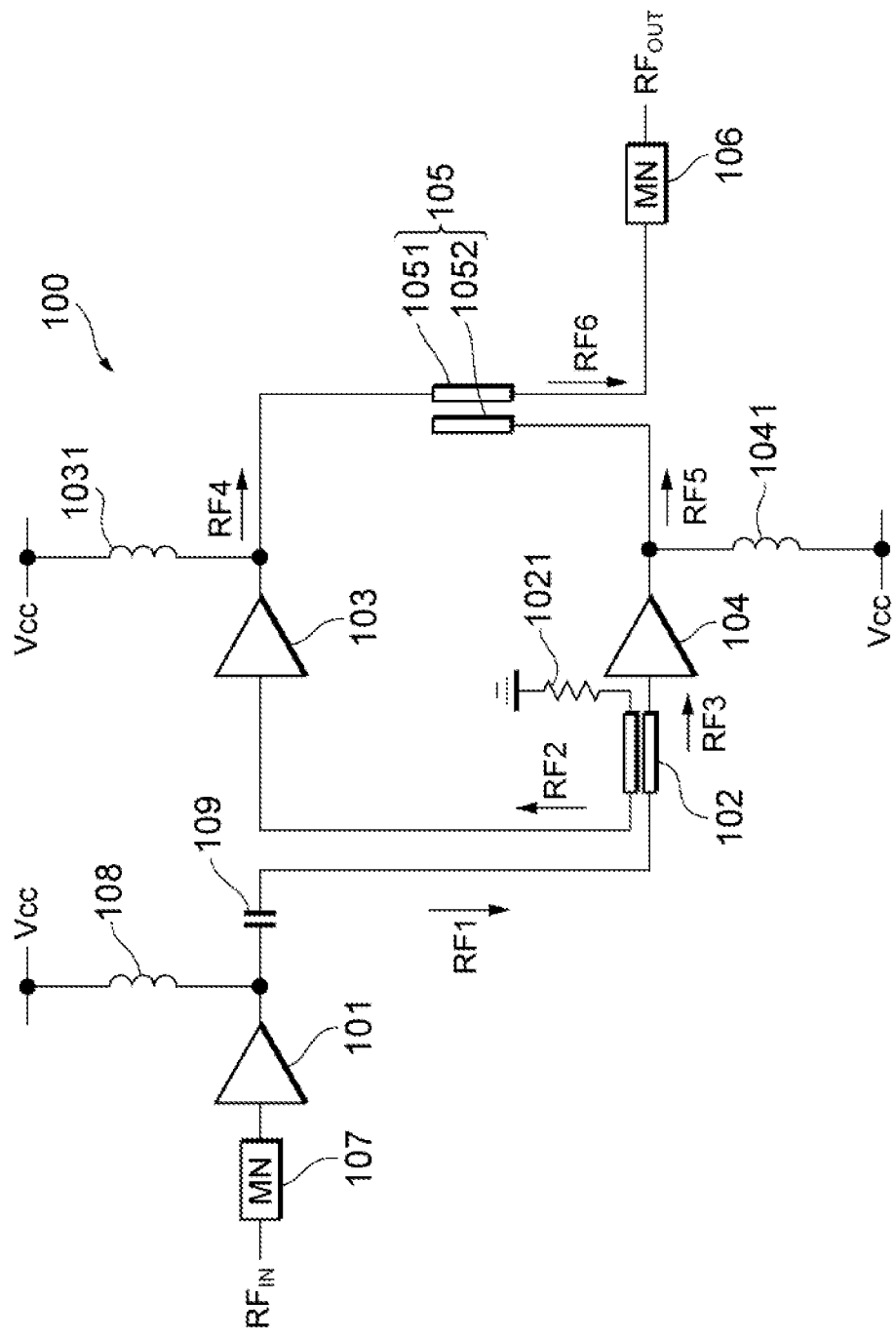
FIG. 1 is a diagram illustrating the configuration of a power amplifier.

Embodiment of the present disclosure will be described in detail below by referring to the drawings. Identical components are designated with identical reference numerals, and repeated description will be avoided as much as possible.

A power amplifier 100 according to a first embodiment will be described. FIG. 1 is a circuit diagram of the power amplifier 100 according to the first embodiment. The power amplifier 100 includes a first-stage amplifier 101, a 3-dB coupler 102, a carrier amplifier 103, a peak amplifier 104, a hybrid coupler 105, matching circuits 106 and 107, an inductor 108, and a capacitor 109. The components of the power amplifier 100 may be formed on the same substrate, or may be formed on multiple substrates.

The first-stage amplifier 101 amplifies signal $RF_{IN}$ which is received through the matching circuit 107, and outputs signal RF1. The frequency of signal $RF_{IN}$ is, for example, on the order of several GHz.

The carrier amplifier 103, the peak amplifier 104, and the hybrid coupler 105 form a second-stage amplifier circuit which amplifies signal RF1 which is output from the first-stage amplifier 101, and has a configuration similar to a typical Doherty amplifier.

The 3-dB coupler 102 (splitter) splits signal RF1 (a first signal), which is output from the first-stage amplifier 101, into signal RF2 (a second signal) for the carrier amplifier 103 and signal RF3 (a third signal) for the peak amplifier 104. Signal RF3 lags behind signal RF2 by about 90°. The 3-dB coupler 102 is grounded through a termination resistor 1021. The 3-dB coupler 102 may have a splitter and a phase shifter which perform 3-dB splitting and phase shifting by about 90°.

The carrier amplifier 103 amplifies signal RF2 from the 3-dB coupler 102, and outputs signal RF4 (a fourth signal). The carrier amplifier 103 is supplied with the power supply voltage Vcc through an inductor 1031.

The peak amplifier 104 amplifies signal RF3 from the 3-dB coupler 102, and outputs signal RF5 (a fifth signal). The peak amplifier 104 is supplied with the power supply voltage Vcc through an inductor 1041.

Figure 2:
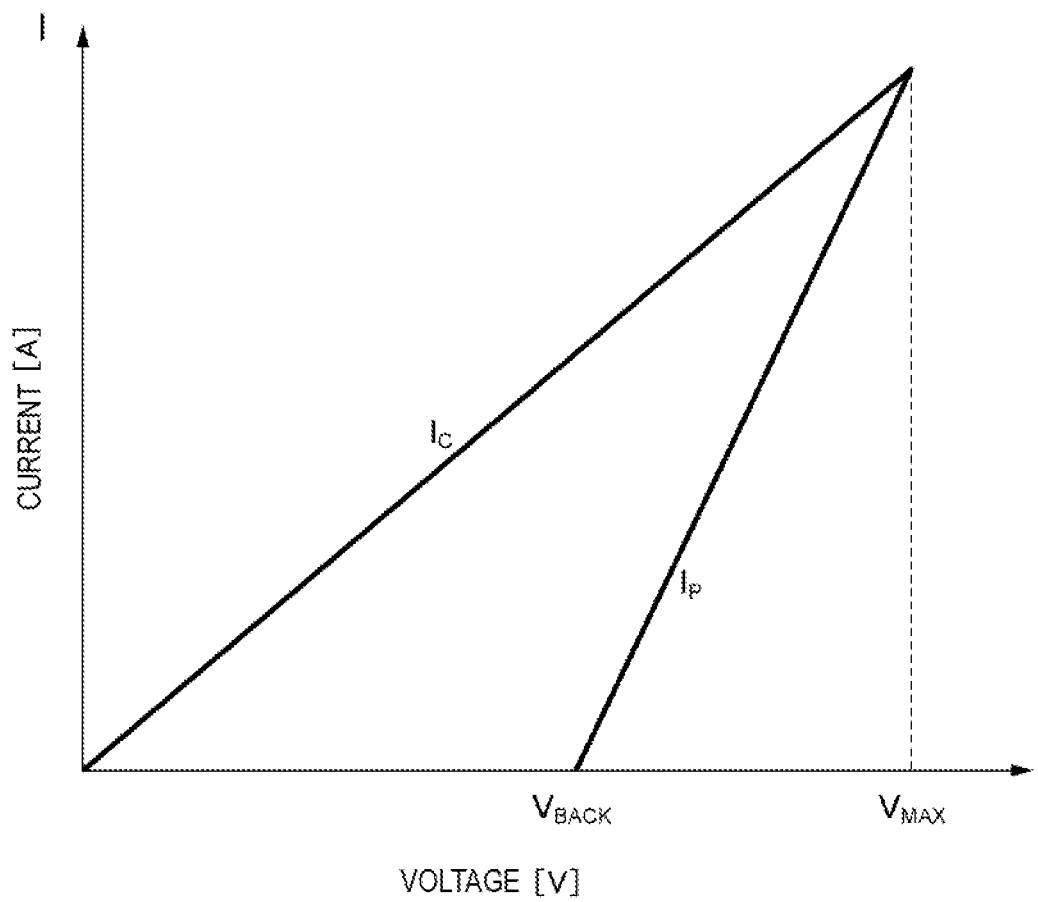
FIG. 2 is a diagram illustrating exemplary operating characteristics of a carrier amplifier and a peak amplifier.

An example of operating characteristics of the carrier amplifier 103 and the peak amplifier 104 will be described by referring to FIG. 2. In FIG. 2, the horizontal axis represents the voltage of signal $RF_{IN}$, and the vertical axis represents currents through the amplifiers. The change in a current through the carrier amplifier 103 is indicated by straight line $I_c$. The change in a current through the peak amplifier 104 is indicated by straight line $I_p$.

The carrier amplifier 103 operates regardless of the voltage level of signal $RF_{IN}$. That is, the carrier amplifier 103 operates regardless of the power level of $RF_{IN}$. In other words, the carrier amplifier 103 operates at such levels that the power level of $RF_{IN}$ is higher than zero (a first level).

The peak amplifier 104 operates in a range of the voltage level of signal $RF_{IN}$ which is equal to or higher than $V_{back}$ that is lower than maximum level $V_{max}$ by a determined level. The peak amplifier 104 operates in a range of the power level of $RF_{IN}$ which is equal to or higher than a low level (a second level) that is lower than the maximum level, for example, by a determined level of 3 dB.

An operation performed when only the carrier amplifier 103 is turned on is called a backoff operation. An operation performed when the carrier amplifier 103 and the peak amplifier 104 are turned on is called a peak operation.

The hybrid coupler 105 illustrated in FIG. 1 includes a transmission line 1051 and a transmission line 1052. The transmission line 1051 and the transmission line 1052 are, for example, strip lines or microstrip lines disposed on or in a substrate.

Both of the transmission line 1051 and the transmission line 1052 are formed so as to extend in a certain direction when the power amplifier 100 is viewed in plan.

The transmission line 1051 is connected, at its first end, to the output of the carrier amplifier 103. The transmission line 1051 is connected, at its second end, to the matching circuit 106. The transmission line 1052 is connected, at its first end, to the output of the peak amplifier 104. The transmission line 1052 is open at its second end. "To be open" herein encompasses a state, in which nothing is physically connected to an end of a transmission line, and also encompasses a case in which a transmission line is connected to a resistor or a passive device whose impedance is equal to or more than a hundredfold of the characteristic impedance of the transmission line.

The hybrid coupler 105 outputs, from the second end of the transmission line 1051, signal RF6 as an amplified signal which is obtained by combining signal RF4 from the carrier amplifier 103 with signal RF5 from the peak amplifier 104.

The matching circuit 107 matches the impedance between the input port of the power amplifier 100 and the first-stage amplifier 101. The matching circuit 106 matches the impedance between the second end of the transmission line 1051 and the output port of the power amplifier 100. Signal RF6 is output as signal $RF_{OUT}$ to the outside of the power amplifier 100 through the matching circuit 106.

The inductor 108 is supplied, at its first end, with the power supply voltage Vcc, and is connected, at its second end, to the output of the first-stage amplifier 101. The capacitor 109 is connected, at its first end, to the output of the first-stage amplifier 101, and is connected, at its second end, to the 3-dB coupler 102.

Figure 3:
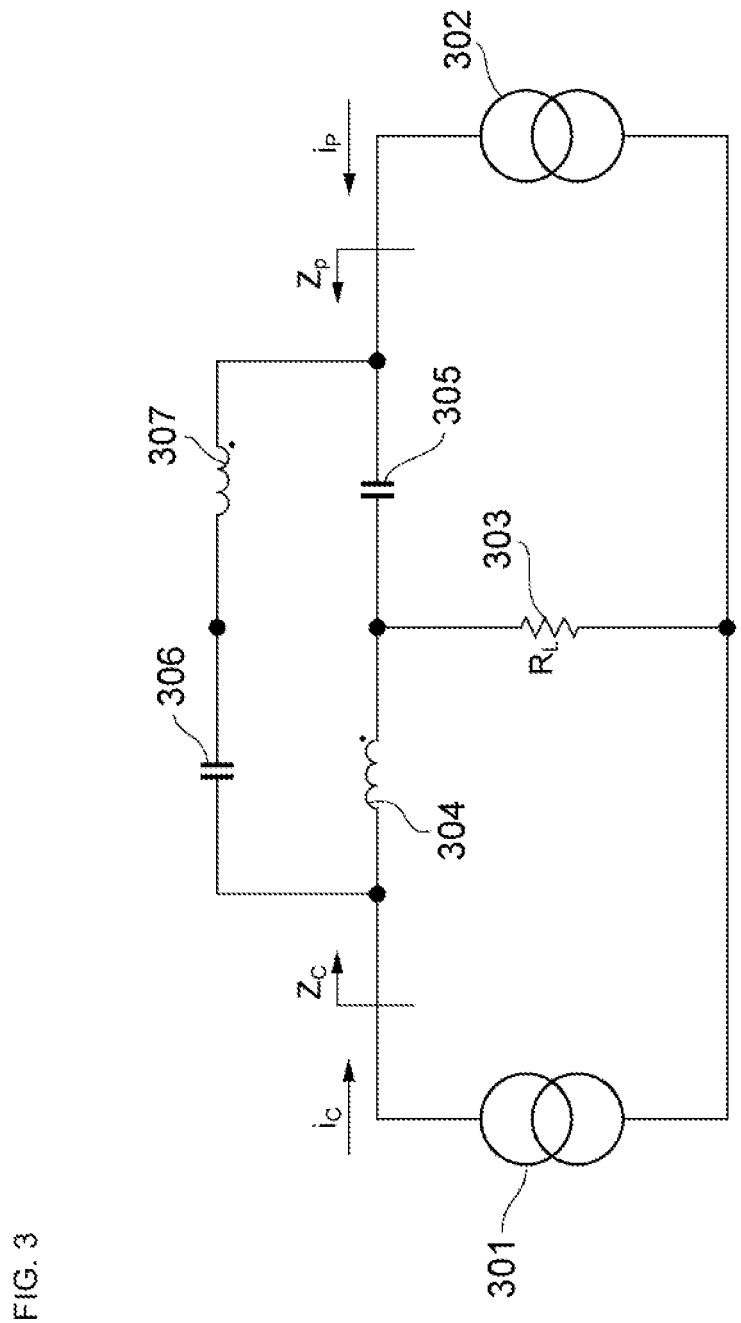
FIG. 3 is an equivalent circuit diagram illustrating a configuration part of a power amplifier.

Referring to FIG. 3, the formulation of the impedance in the power amplifier 100 will be described. FIG. 3 is a circuit diagram illustrating circuits obtained by modeling the power amplifier 100 as a current source model. The circuits illustrated in FIG. 3 include current sources 301 and 302, a load resistance 303, an inductor 304, a capacitor 305, a capacitor 306, and an inductor 307.

The output of the current source 301 is connected to a first end of the inductor 304 and a first end of the capacitor 306. The output of the current source 302 is connected to a first end of the capacitor 305 and a first end of the inductor 307.

The capacitor 306 is connected, at its second end, to a second end of the inductor 307. The inductor 304 is connected, at its second end, to a second end of the capacitor 305 and a first end of the load resistance 303. The load resistance 303 is connected, at its second end, to the current source 301 and the current source 302.

The current source 301 corresponds to the carrier amplifier 103. The current source 302 corresponds to the peak amplifier 104. The load resistance 303 indicates the resistance of a load to which the resulting signal, which is amplified by the power amplifier 100, is output.

The inductor 304 indicates the inductance of the transmission line 1051. The inductor 307 indicates the inductance of the transmission line 1052. The capacitor 305 and the capacitor 306 indicate the capacitance produced between the transmission line 1051 and the transmission line 1052. Mutual inductance is produced between the inductor 304 and the inductor 307.

The transmission line 1051 and the transmission line 1052 are disposed so that inductance L of each of the inductor 304 and the inductor 307, capacitance C of each of the capacitor 305 and the capacitor 306, and mutual inductance M between the inductor 304 and the inductor 307 satisfy Expression (1).

$$L = \frac{R_L}{\omega_0}, C = \frac{1}{2R_L\omega_0}, M = \frac{R_L}{\omega_0} \quad (1)$$

In Expression (1), $R_L$ represents the impedance of the load resistance 303; $\omega_0$ represents the angular frequency corresponding to the center frequency of signal $RF_{IN}$.

The voltage at the output of the current source 301 is represented by $V_C$. The voltage at the output of the current source 302 is represented by $V_P$. The current flowing from the current source 301 is represented by $i_C$. The current flowing from the current source 302 is represented by $i_P$. In this case, impedance $Z_C$, as seen from the output of the current source 301, and impedance $Z_P$, as seen from the output of the current source 302, are derived as follows.

The current flowing from the capacitor 306 to the inductor 307 is represented by ix. In this case, Expression (2) described below holds.

$$V_C - V_P = \quad (2)$$
$$i_C j\omega L + (i_C + i_P)R_L - \frac{i_P + i_X}{j\omega C} - (i_C + i_P)R_L = \frac{i_X}{j\omega C} + i_c j\omega M$$

The symbol j represents the imaginary unit.

The center component of Expression (2) indicates calculation of $V_C-V_P$ from the difference between $V_C$ and $V_P$ in the following manner: $V_C$ is obtained by using a voltage decrease obtained through the current source 301, the inductor 304, and the load resistance 303 in this sequence; $V_P$ is obtained by using a voltage decrease obtained through the current source 302, the capacitor 305, and the load resistance 303 in this sequence.

The right-side component of Expression (2) indicates calculation of $V_C-V_P$ by using a voltage decrease obtained through the current source 301, the capacitor 306, the inductor 307, and the current source 302 in this sequence. Thus, ix is expressed in Expression (3) by using the relation between the center component and the right-side component in Expression (2).

$$i_X = -\frac{i_P}{2} \quad (3)$$

Therefore, voltages $V_C$ and $V_P$ are expressed in Expression (4) and Expression (5).

$$V_C = i_C j\omega L + (i_c + i_p)R_L \quad (4)$$

$$V_P = \frac{i_P}{j2\omega C} + (i_c + i_p)R_L \quad (5)$$

Assume that $\omega=\omega_0$ in Expression (4) and Expression (5).

$$Z_C = \frac{V_C}{i_C} = jR_L + \left(1 + \frac{i_P}{i_C}\right)R_L \quad (6)$$

$$Z_P = \frac{V_P}{i_P} = -jR_L + \left(1 + \frac{i_C}{i_P}\right)R_L \quad (7)$$

Assume that the power amplifier 100 performs a peak operation. That is, assume that both the carrier amplifier 103 and the peak amplifier 104 operate. The amplitude of $i_C$ and that of $i_P$ are represented by $I_C$ and $I_P$, respectively. In consideration of the phase difference produced by the 3-dB coupler 102, $i_C=I_C$ and $i_P=-jI_P$ hold. The final impedance is expressed in Expression (8) and Expression (9) by using Expression (6) and Expression (7).

$$Z_C = R_L + jR_L\left(1 - \frac{I_P}{I_C}\right) \quad (8)$$

$$Z_P = R_L + jR_L\left(\frac{I_C}{I_P} - 1\right) \quad (9)$$

As a reference example, the impedance in a power amplifier 1100 illustrated in FIG. 11 will be described. The power amplifier 1100 is different from the power amplifier 100 in that the power amplifier 1100 includes a phase shifter 1101 having an inductor 1102, a phase shifter 1103 having a capacitor 1104, and a combining unit 1105. The power amplifier 1100 functions as a Doherty amplifier.

Figure 12:
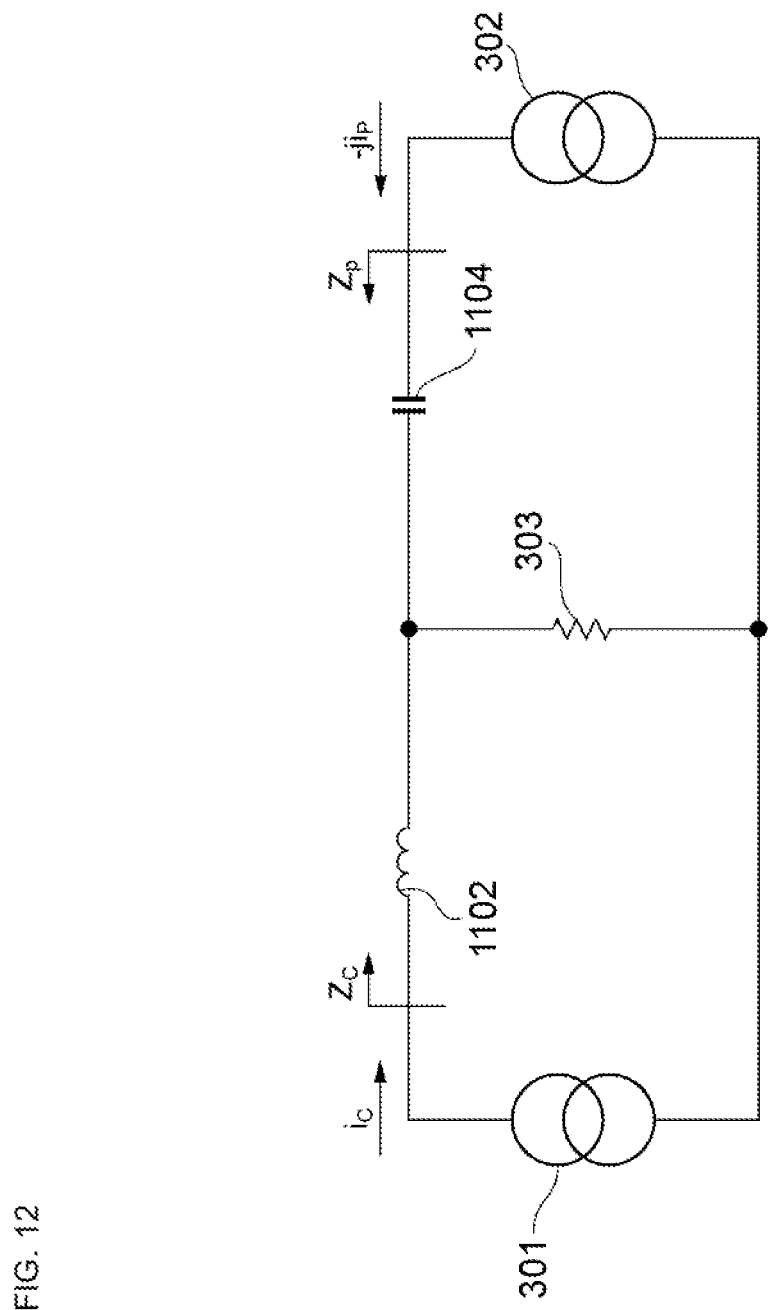
FIG. 12 is an equivalent circuit diagram illustrating a configuration part of a power amplifier according to the reference example.

FIG. 12 illustrates a calculation model of the impedance of the power amplifier 1100. Inductance L of the inductor 1102 and capacitance C of the capacitor 1104 satisfy Expression (10).

$$L = \frac{R_L}{\omega_0}, C = \frac{1}{R_L\omega_0} \quad (10)$$

In this case, impedance $Z_C$, as seen from the current source 301 toward the load resistance 303, and impedance $Z_P$, as seen from the current source 302 toward the load resistance 303, have the same results in Expression (8) and Expression (9) through calculation similar to that in the model of the power amplifier 100.

In addition to the calculation using the model, simulation results will be described by comparing FIGS. 4 to 8 with FIGS. 13 to 17. The simulation uses an ideal model without necessarily consideration of the resistance in the transmission line 1051 and the transmission line 1052.

Figure 4:
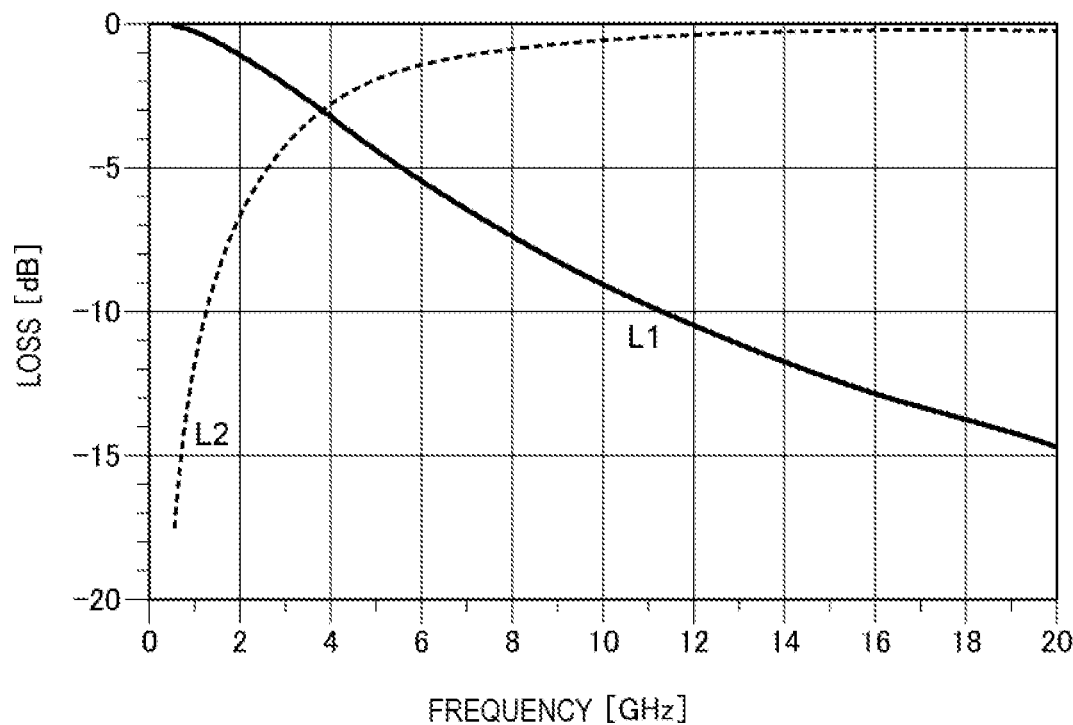
FIG. 4 is a diagram illustrating a simulation result of loss in a power amplifier.

FIG. 4 is a graph indicating loss in the power amplifier 100. Curve L1 indicates the insertion loss of the output of the carrier amplifier 103. It shows that, as the frequency increases, the loss increases due to the inductance of the transmission line 1051. For example, the value of the insertion loss at a frequency of 3.75 GHz in curve L1 is −3.010 dB. Curve L2 indicates the insertion loss of the output of the peak amplifier 104. It shows that, as the frequency increases, the loss decreases due to the capacitance, which behaves like a lead wire, between the transmission line 1051 and the transmission line 1052. For example, the value of the insertion loss at a frequency of 3.70 GHz is −3.069.

Figure 13:
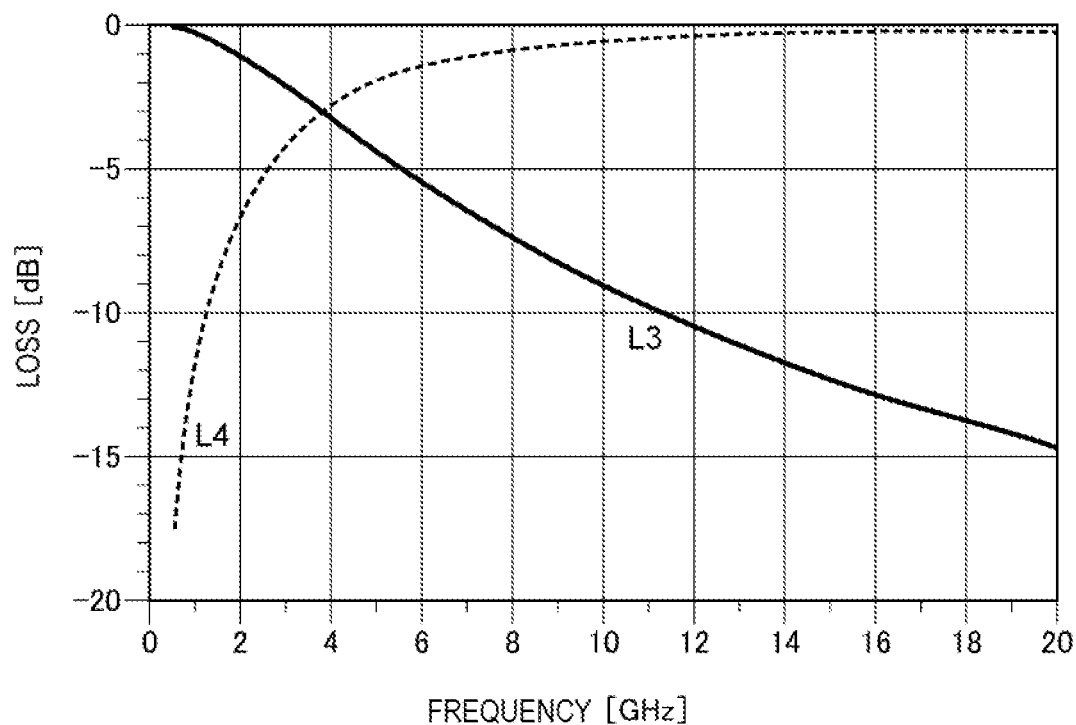
FIG. 13 is a diagram illustrating a simulation result of loss in a power amplifier according to the reference example.

The reference example corresponding to FIG. 4 is the graph illustrating loss in the power amplifier 1100 in FIG. 13. Curve L3 indicates the insertion loss of the output of the carrier amplifier 103 in the power amplifier 1100. Curve L4 indicates the insertion loss of the output of the peak amplifier 104 in the power amplifier 1100. Curve L3 behaves like curve L1, and curve L4 behaves like curve L2.

Figure 5:
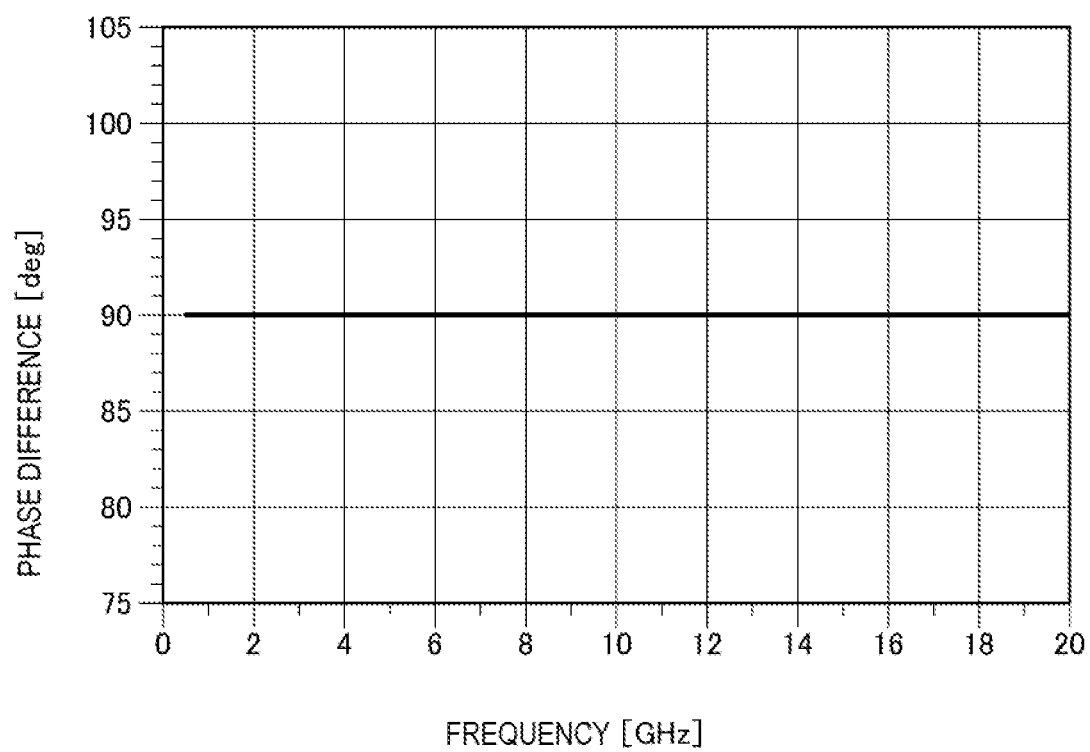
FIG. 5 is a diagram illustrating a simulation result of the phase difference in a power amplifier.

FIG. 5 is a graph illustrating the phase difference in the power amplifier 100 which is obtained by subtracting the phase of a signal, which is output from the carrier amplifier 103 through the hybrid coupler 105, from the phase of a signal which is output from the peak amplifier 104 through the hybrid coupler 105.

The phase difference in the graph in FIG. 5 is 90°. That is, the hybrid coupler 105 functions as a 90° hybrid coupler. Signal RF5, which is output from the peak amplifier 104, lags behind signal RF4, which is output from the carrier amplifier 103, by about 90°. Thus, the phase difference of 90° indicates that the signals are output as an in-phase signal from the hybrid coupler 105.

Figure 14:
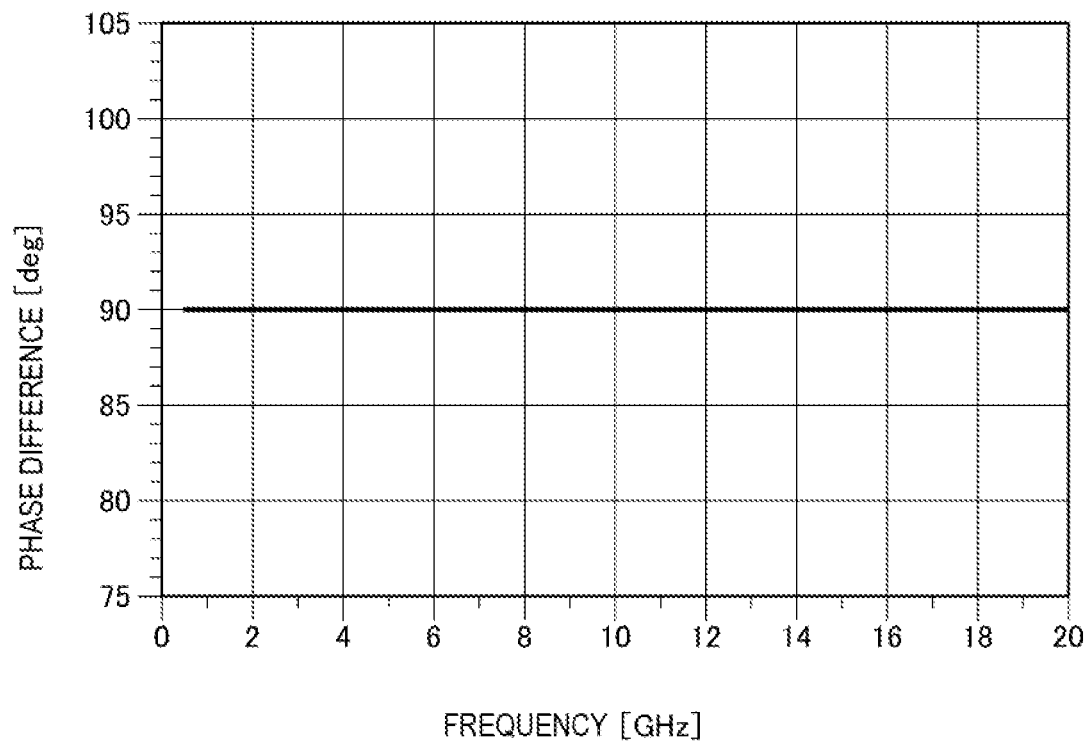
FIG. 14 is a diagram illustrating a simulation result of the phase difference in a power amplifier according to the reference example.

The reference example corresponding to FIG. 5 is the graph illustrating the phase difference, which is calculated similarly in the power amplifier 1100, in FIG. 14. The phase difference in FIG. 14 is also 90°. The output from the combining unit 1105 is in phase.

Figure 6:
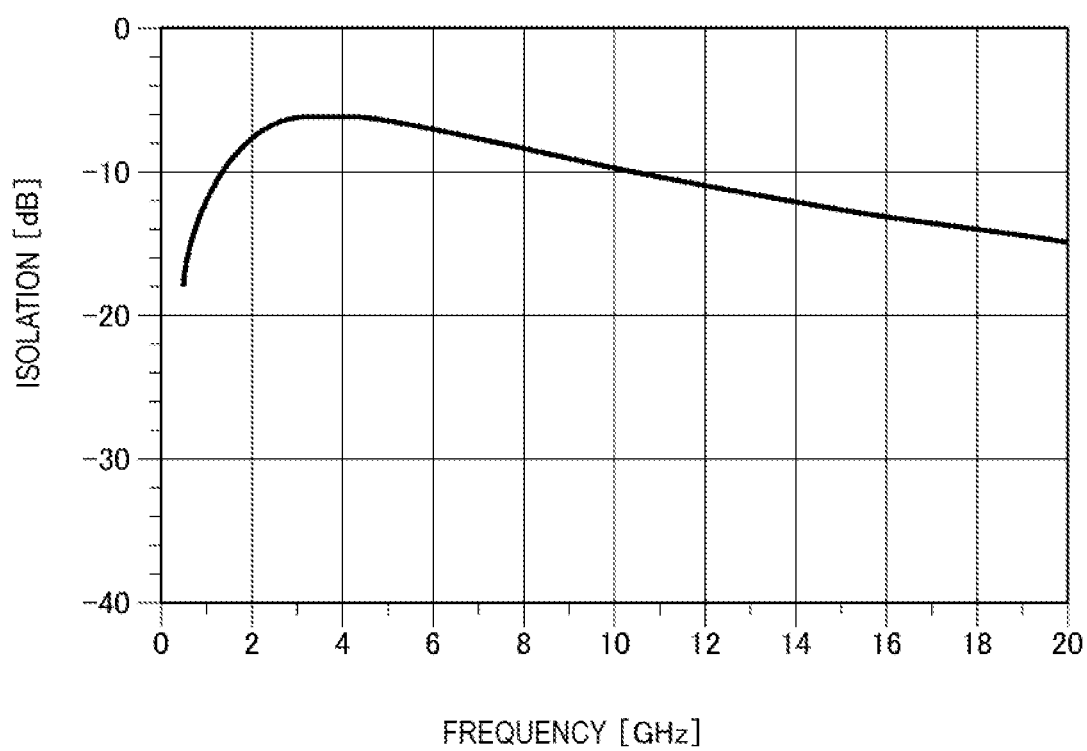
FIG. 6 is a diagram illustrating a simulation result of isolation in a power amplifier.

FIG. 6 is a graph illustrating the isolation of signal RF4, which is input to the transmission line 1051, in the power amplifier 100. That is, FIG. 6 is a graph illustrating the degree of leakage of signal RF4 to the transmission line 1052. In FIG. 6, the isolation is −6.021 dB at a frequency of 3.75 GHz.

Figure 15:
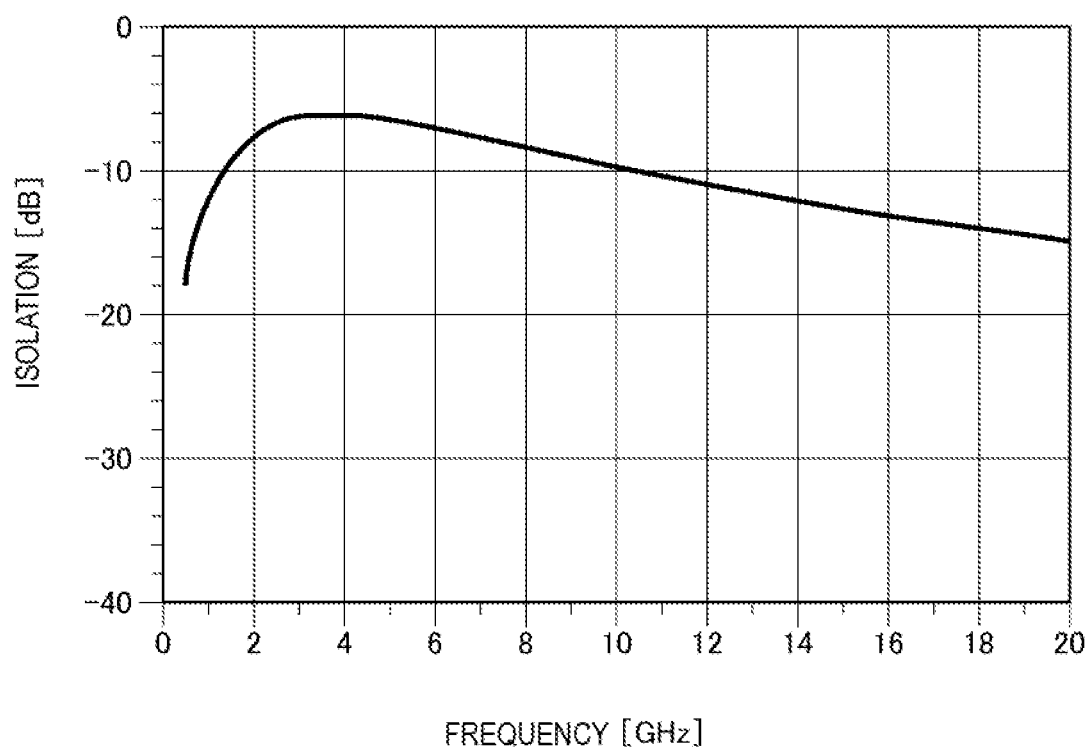
FIG. 15 is a diagram illustrating a simulation result of isolation in a power amplifier according to the reference example.

The reference example corresponding to FIG. 6 is the graph illustrating the isolation, which is calculated similarly, in the power amplifier 1100 in FIG. 15. In FIG. 15, the isolation changes as in FIG. 6.

Figure 7:
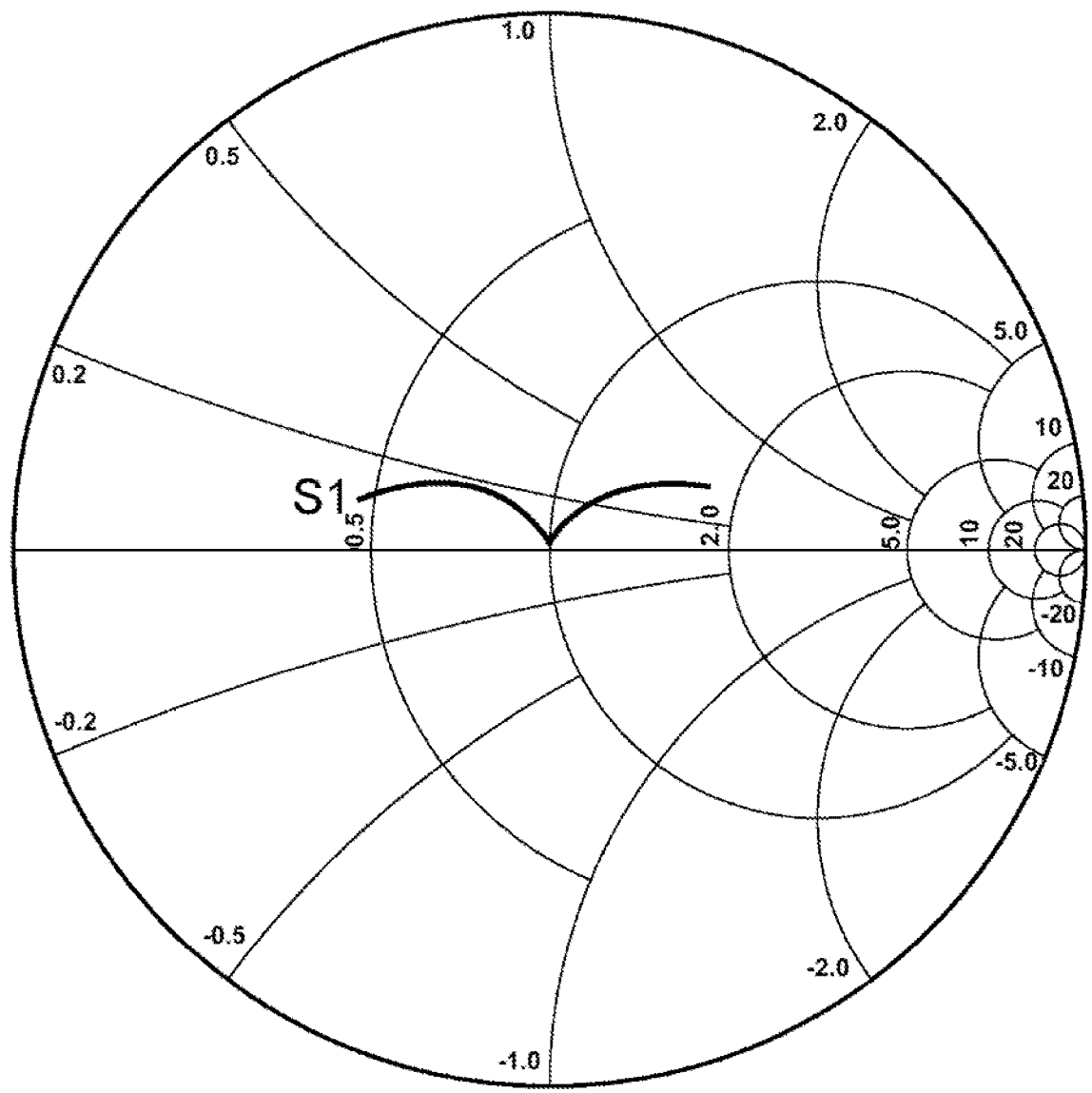
FIG. 7 is a diagram illustrating a locus of the impedance on the load side, as seen from the output port of a carrier amplifier, in a peak operation.
Figure 8:
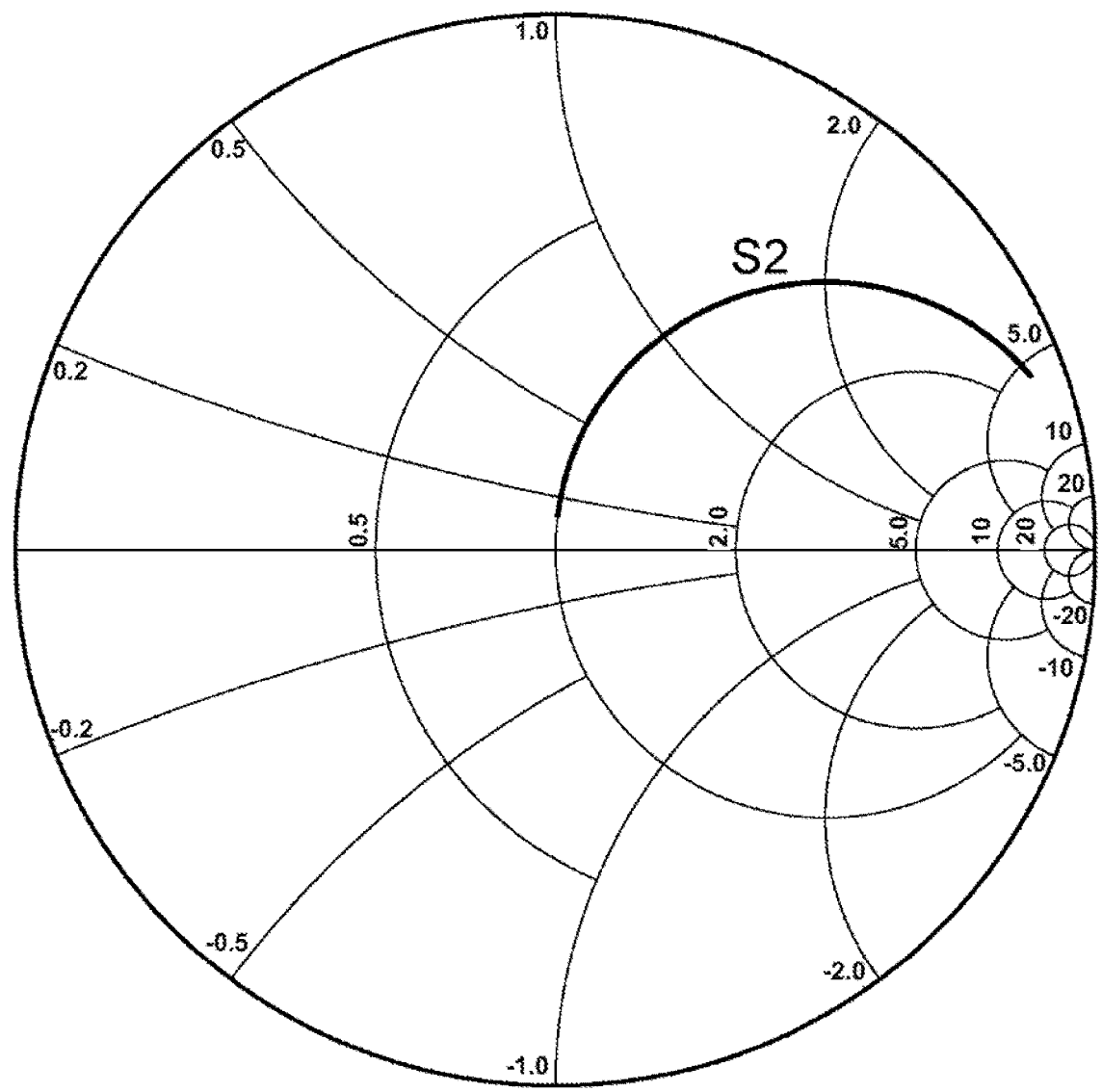
FIG. 8 is a diagram illustrating a locus of the impedance on the load side, as seen from the output port of a carrier amplifier, in a backoff operation.

FIG. 7 is a Smith chart for describing the impedance as seen from the carrier amplifier 103 toward the output side in the case where the power amplifier 100 performs a peak operation. FIG. 8 is a Smith chart for describing the impedance as seen from the carrier amplifier 103 toward the output side in the case where the power amplifier 100 performs a backoff operation. Curve S1 in FIG. 7 and curve S2 in FIG. 8 indicate loci obtained when the frequency changes from 500 MHz to 20 GHz.

Figure 16:
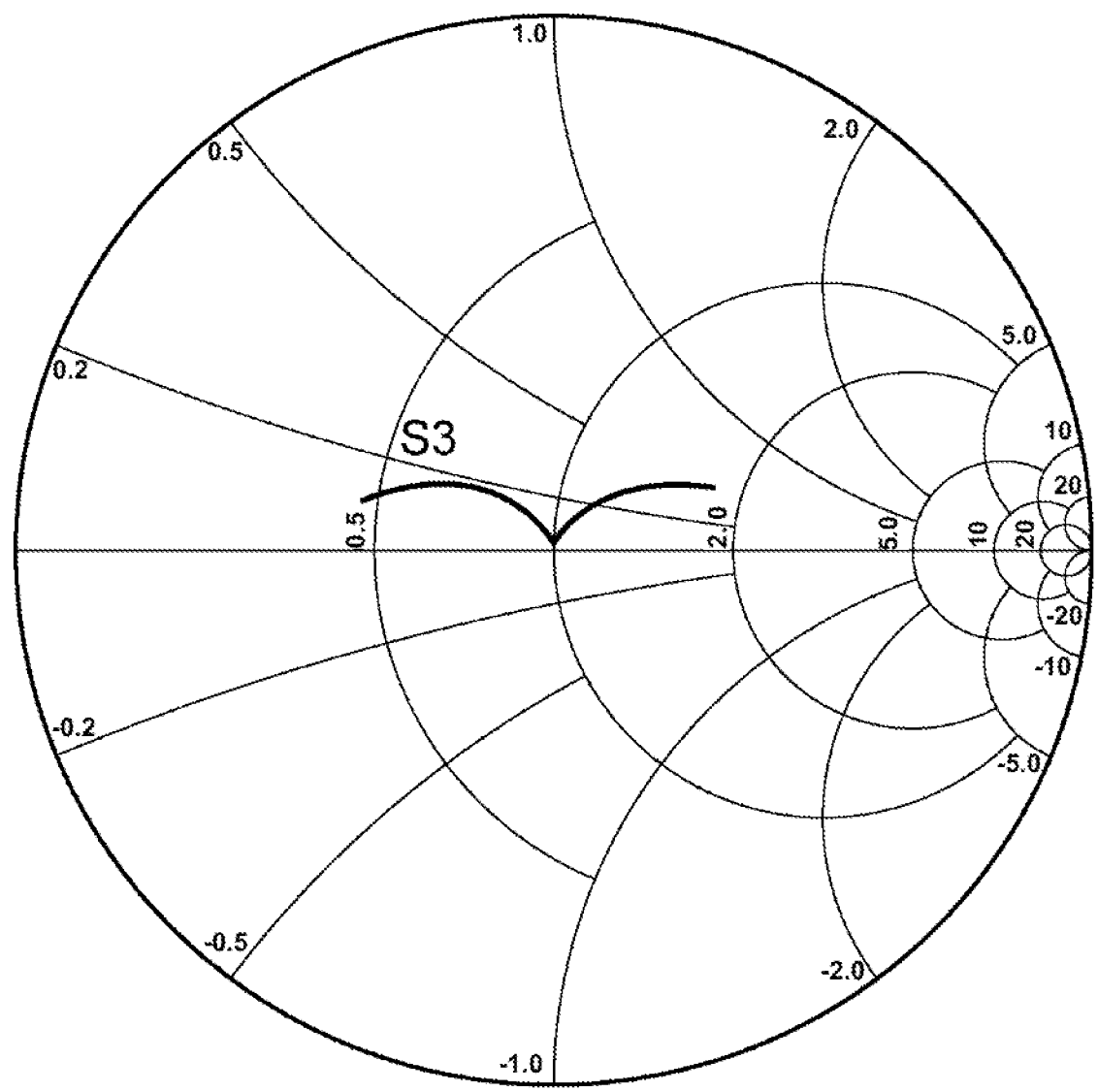
FIG. 16 is a diagram illustrating a locus of the impedance on the load side, as seen from the output port of a carrier amplifier, in a peak operation of a power amplifier according to the reference example.
Figure 17:
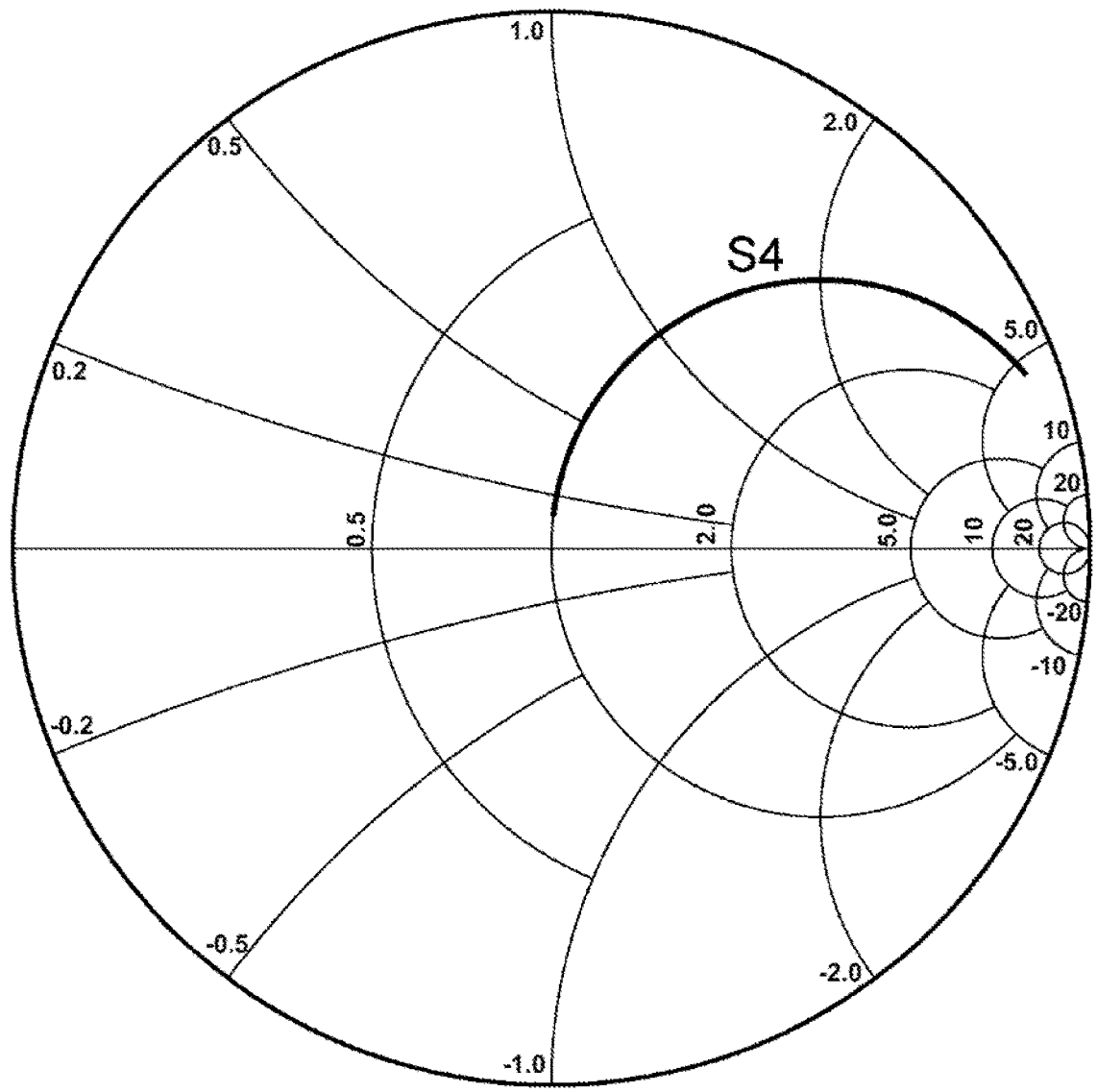
FIG. 17 is a diagram illustrating a locus of the impedance on the load side, as seen from the output port of a carrier amplifier, in a backoff operation of a power amplifier according to the reference example.

The reference example corresponding to FIG. 7 is FIG. 16, and the reference example corresponding to FIG. 8 is FIG. 17. FIG. 16 is a Smith chart for describing the impedance which is obtained similarly in the case where the power amplifier 1100 performs a peak operation. FIG. 17 is a Smith chart for describing the impedance which is obtained similarly in the case where the power amplifier 1100 performs a backoff operation. Curve S3 in FIG. 16 and curve S4 in FIG. 17 indicate loci obtained when the frequency changes from 500 MHz to 20 GHz.

It is shown that, in the Smith charts in FIG. 16 and FIG. 17, the loci change as in the Smith charts in FIG. 7 and FIG. 8.

FIGS. 4 to 8 and FIGS. 13 to 17 indicate that the power amplifier 100 operates like the power amplifier 1100 which functions as a Doherty amplifier. Therefore, the power amplifier 100 functions as a Doherty amplifier.

Figure 9:
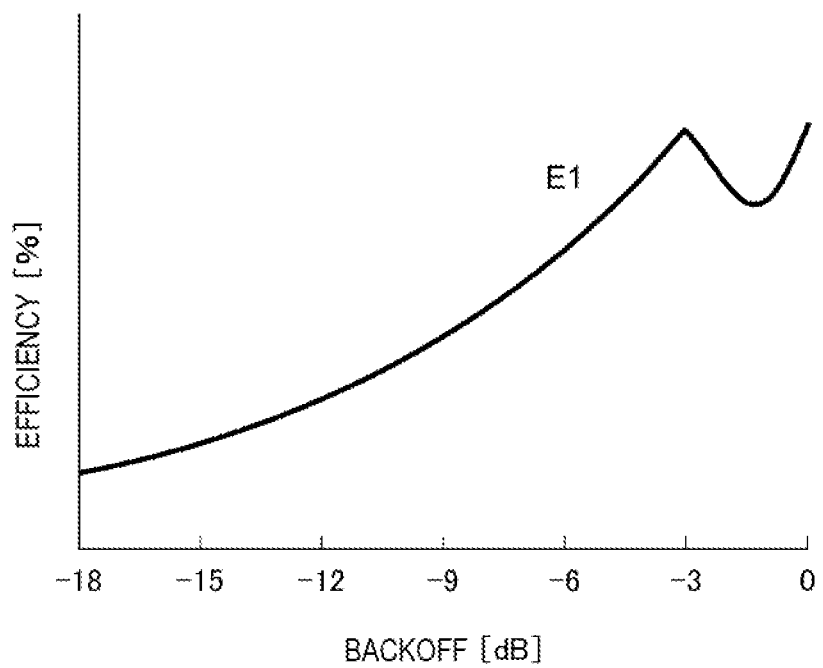
FIG. 9 is a diagram for describing the efficiency of a power amplifier.

FIG. 9 illustrates the efficiency in the power amplifier 100, which is obtained in the case where the horizontal axis represents the decibel value relative to the peak power of an input signal, that is, the backoff value. FIG. 9 shows that the power amplifier 100 performs a peak operation when the backoff amount exceeds 3 dB, functioning as a Doherty amplifier which maintains high efficiency.

Figure 10:
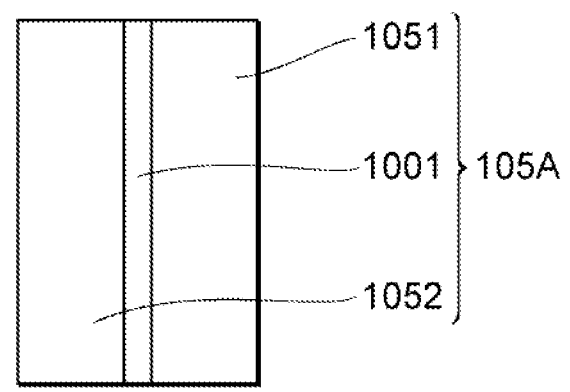
FIG. 10 is a diagram illustrating another form of a hybrid coupler.

FIG. 10 is a diagram illustrating a modified example of the hybrid coupler 105. A hybrid coupler 105A includes a dielectric 1001 between the transmission line 1051 and the transmission line 1052. The dielectric 1001 is, for example, a dielectric layer which has a high relative permittivity. The hybrid coupler 105A having a metal-insulator-metal (MIM) structure may shorten the length of the transmission line 1051 and the transmission line 1052 for achieving a determined capacitance between the transmission line 1051 and the transmission line 1052.

Figure 18:
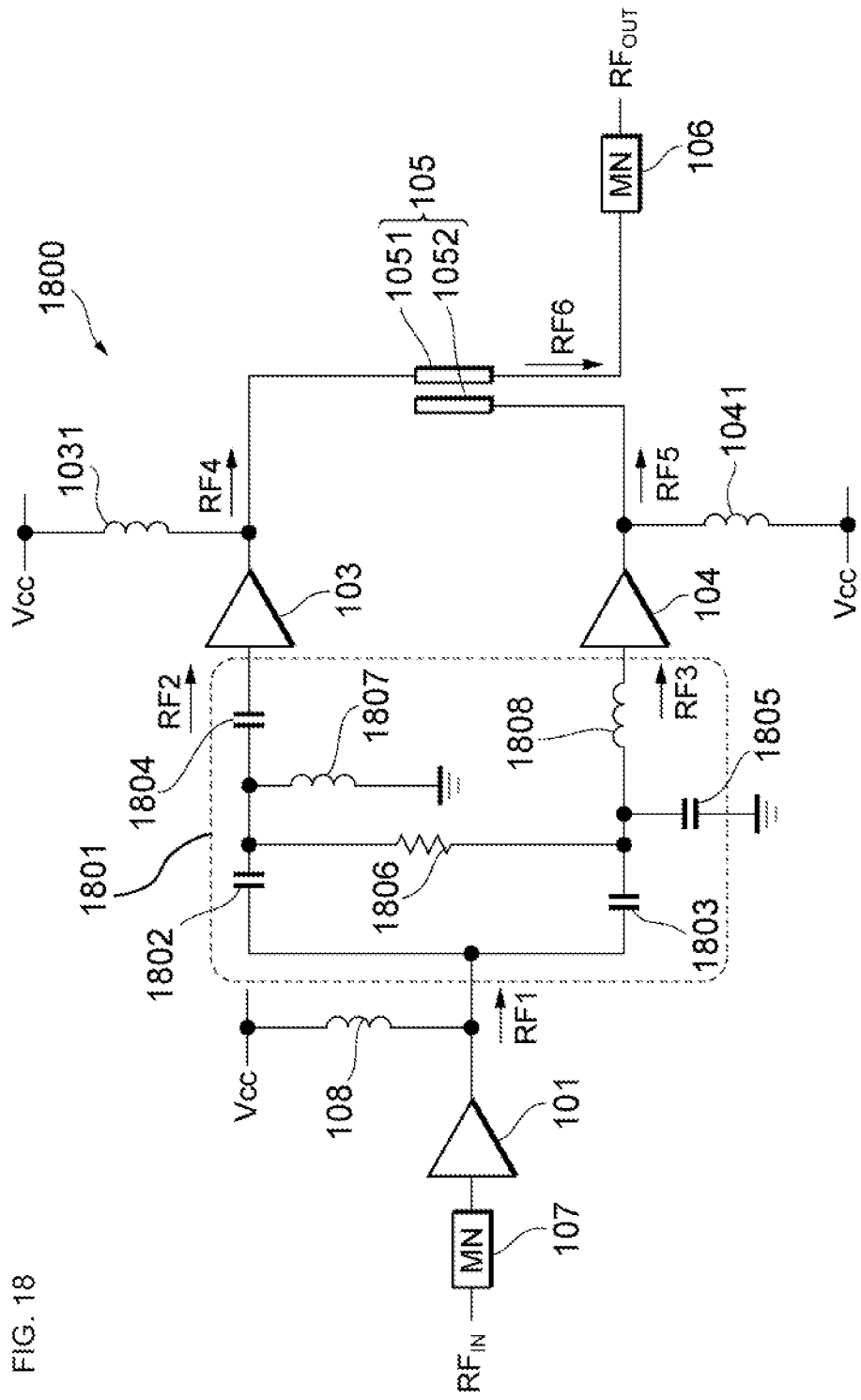
FIG. 18 is a diagram illustrating the configuration of a power amplifier according to a second embodiment.

A second embodiment will be described. Points common to the first embodiment will not be described in the second embodiment, and only different points will be described. Especially, similar effects caused by similar configurations will not be described in each embodiment. FIG. 18 illustrates a circuit diagram of a power amplifier 1800 according to the second embodiment.

The power amplifier 1800 is different from the power amplifier 100 in that a splitter 1801 is included between the first-stage amplifier 101, and the carrier amplifier 103 and the peak amplifier 104.

The splitter 1801 includes capacitors 1802, 1803, 1804, and 1805, a resistance device 1806, and inductors 1807 and 1808.

The capacitor 1802 is connected, at its first end, to the output of the first-stage amplifier 101, and is connected, at its second end, to a first end of the resistance device 1806. The capacitor 1803 is connected, at its first end, to the output of the first-stage amplifier 101, and is connected, at its second end, to a second end of the resistance device 1806. The resistance device 1806 is disposed between the capacitor 1802 and the capacitor 1803.

The capacitor 1804 is connected, at its first end, to the second end of the capacitor 1802, and is connected, at its second end, to the input of the carrier amplifier 103. The inductor 1807 is connected, at its first end, between the capacitor 1804 and the second end of the capacitor 1802, and is connected, at its second end, to the ground. The capacitor 1804 and the inductor 1807 function as a phase shifter.

The capacitor 1805 is connected, at its first end, to the second end of the capacitor 1803, and is connected, at its second end, to the ground. The inductor 1808 is connected, at its first end, to the first end of the capacitor 1805, and is connected, at its second end, to the input of the peak amplifier 104. The capacitor 1805 and the inductor 1808 function as a phase shifter.

The splitter 1801 splits signal RF1 from the first-stage amplifier 101 into signal RF2 and signal RF3.

The capacitor 1805 and the inductor 1808 change the phase of signal RF3 so that the change amount of the phase of signal RF2 and the positive-negative direction of signal RF2, which are produced by the capacitor 1804 and the inductor 1807, are symmetric to those of signal RF3.

The parameters of the circuit devices in the splitter 1801 are set so that signal RF3 lags behind signal RF2 by −2θ° where θ, which is expressed in Expression (11), represents a change in the phase of signal RF2 which is produced by the capacitor 1804 and the inductor 1807. The value, 2θ, changes in a range which is equal to or greater than 90° and less than 180°.

$$\theta = \tan^{-1}\left(\sqrt{n-1}\right) \quad (11)$$

The impedance of the power amplifier 1800 will be described. The model for describing the impedance of the power amplifier 1800 is the same as that in FIG. 3. Like the description about the power amplifier 100, impedance $Z_C$, as seen from the output of the current source 301, and impedance $Z_P$, as seen from the output of the current source 302, are expressed in Expression (6) and Expression (7).

When a phase lag which is expressed by using Expression (11) occurs, $i_C$ and $i_P$ are expressed in Expression (12) where the amplitudes of $i_C$ and $i_P$ are represented by $I_C$ and $I_P$, respectively.

$$i_c = I_C, \; i_p = e^{j(-2\theta)} I_P = -\left\{\frac{n-2}{n} + \frac{2\sqrt{n-1}}{n}j\right\} I_P \quad (12)$$

By using Expression (12), Expression (6), and Expression (7), the impedance is expressed finally in Expression (13) and Expression (14).

$$Z_C = \left(1 - \frac{I_P}{I_C} \cdot \frac{n-2}{n}\right) R_L + j R_L \left(1 - \frac{I_P}{I_C} \cdot \frac{2\sqrt{n-1}}{n}\right) \quad (13)$$

$$Z_P = \left(1 - \frac{I_C}{I_P} \cdot \frac{n-2}{n}\right) R_L - j R_L \left(1 - \frac{I_C}{I_P} \cdot \frac{2\sqrt{n-1}}{n}\right) \quad (14)$$

FIGS. 19 to 23 illustrate simulation results obtained when θ=60°, that is, when signal RF3 lags behind signal RF2 by 120°. FIGS. 19 to 23 will be described by referring to FIGS. 24 to 28.

Figure 11:
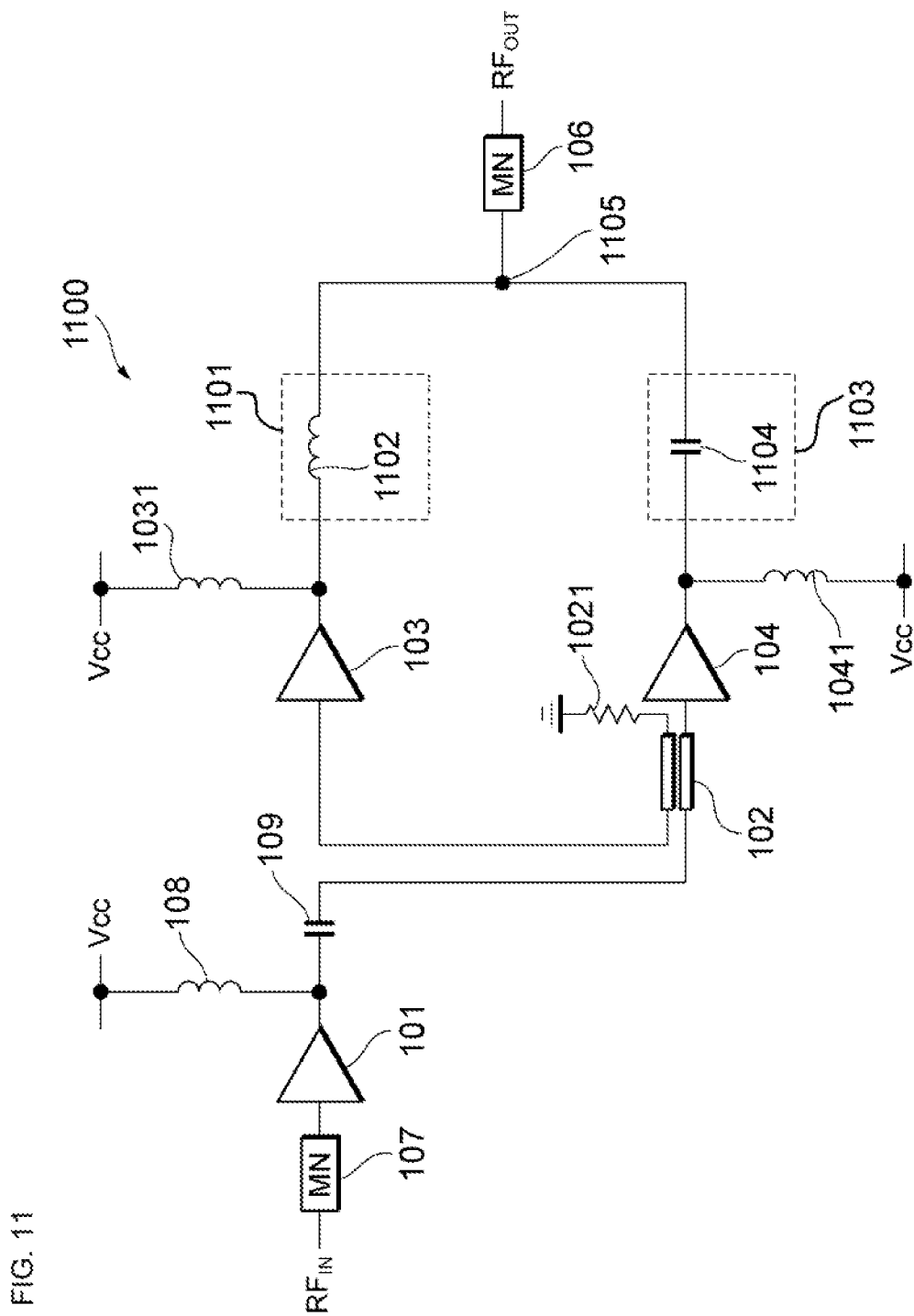
FIG. 11 is a diagram illustrating the configuration of a power amplifier according to a reference example.

The results in FIGS. 19 to 23 are obtained when, like the power amplifier 1100 in FIG. 11, the phase shifter 1101, the phase shifter 1103, and the combining unit 1105, instead of the hybrid coupler 105, are used to combine the outputs in the power amplifier 1800 illustrated in FIG. 18. The parameters of the phase shifter 1101 and the phase shifter 1103 are values different from those used in the case where the phase lag is 90°.

Figure 19:
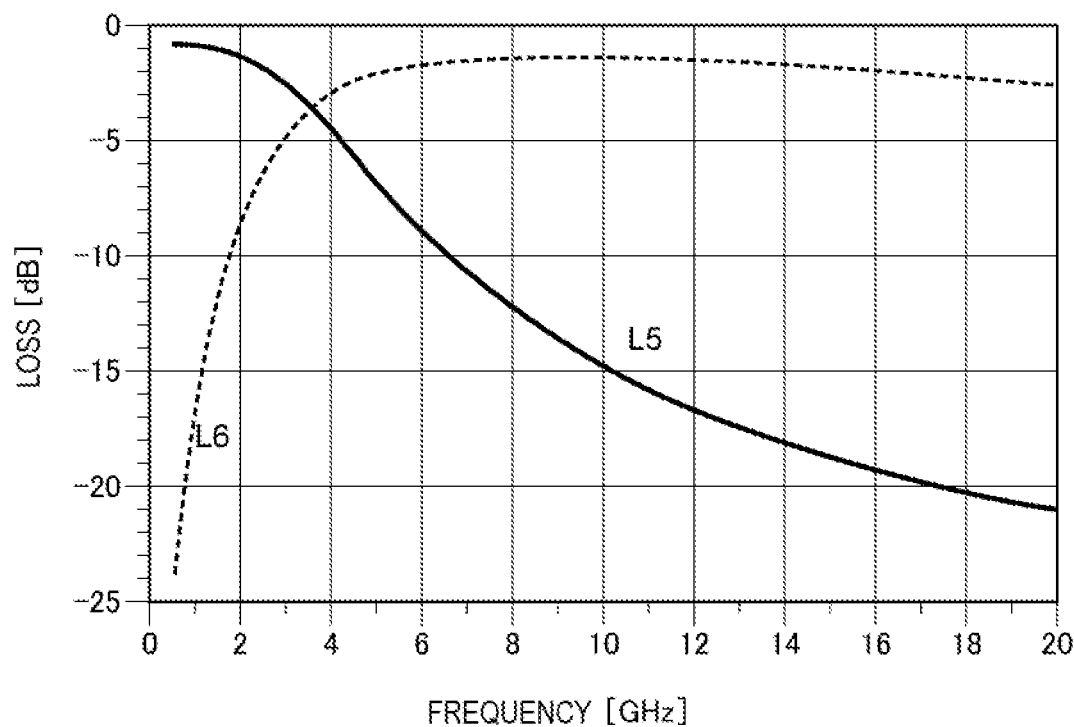
FIG. 19 is a diagram illustrating a simulation result of loss in a power amplifier according to the second embodiment.

FIG. 19 is a graph illustrating loss in the power amplifier 1800. Curve L5 indicates the insertion loss of the output of the carrier amplifier 103. It shows that, as the frequency increases, the loss increases due to the inductance of the transmission line 1051. For example, the value of the insertion loss at a frequency of 3.75 GHz in curve L5 is −4.090 dB. Curve L6 indicates the insertion loss of the output of the peak amplifier 104. It shows that, as the frequency increases, the capacitance between the transmission line 1051 and the transmission line 1052 behaves like a lead wire and the loss decreases. For example, the value of the insertion loss at a frequency of 3.70 GHz is −3.42.

Figure 24:
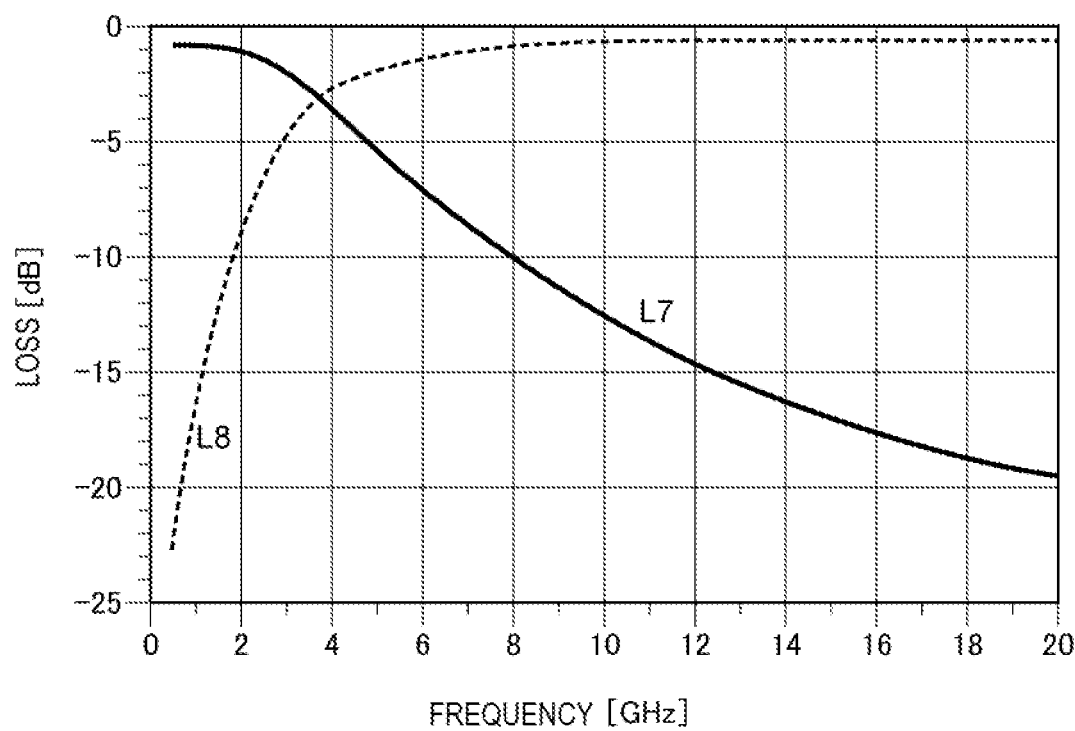
FIG. 24 is a diagram illustrating a simulation result of loss in a power amplifier according to a reference example of the second embodiment.

The reference example corresponding to FIG. 19 is the graph illustrating the loss in FIG. 24. Curve L7 indicates the insertion loss of the output of the carrier amplifier 103. Curve L8 indicates the insertion loss of the output of the peak amplifier 104.

Figure 20:
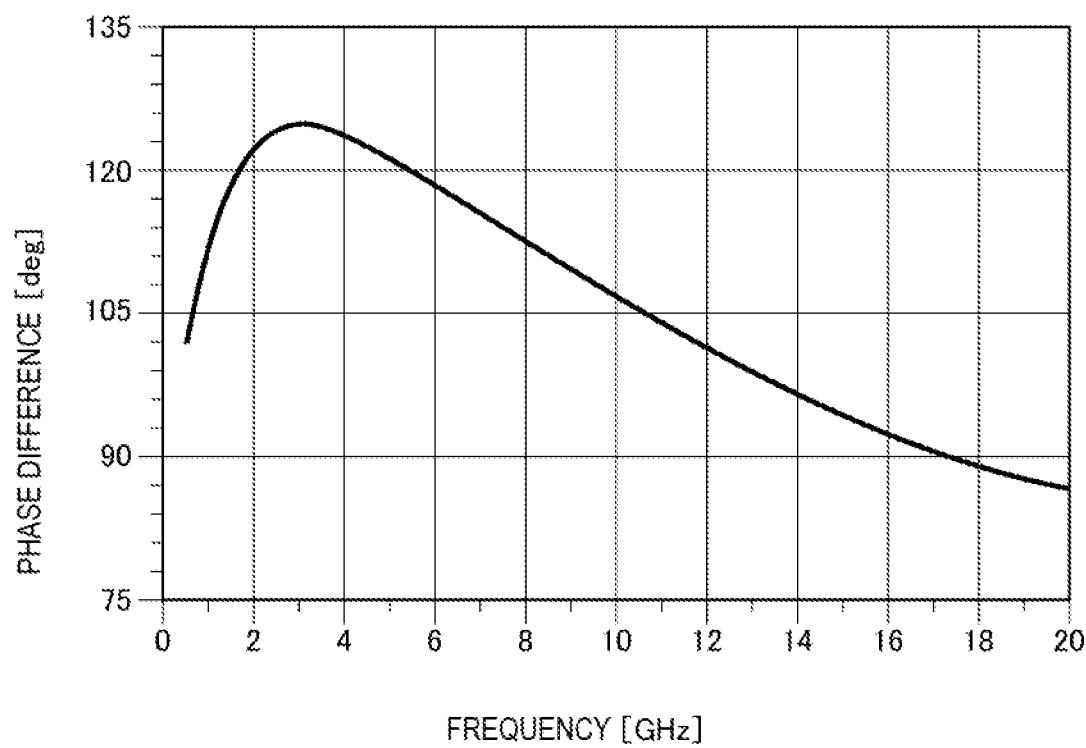
FIG. 20 is a diagram illustrating a simulation result of the phase difference in a power amplifier according to the second embodiment.

FIG. 20 is a graph illustrating the phase difference obtained by subtracting the phase of a signal, which is output from the carrier amplifier 103 through the hybrid coupler 105, from the phase of a signal which is output from the peak amplifier 104 through the hybrid coupler 105, in the power amplifier 1800.

In the graph in FIG. 20, the phase difference is approximately 120° in the frequency range between 2 GHz and 6 GHz. That is, the hybrid coupler 105 functions as a coupler which combines signals whose phase difference is 120°. It is shown that, since signal RF5, which is output from the peak amplifier 104, lags behind signal RF4, which is output from the carrier amplifier 103, by about 120°, the phase difference of about 120° causes an almost in-phase signal to be output from the hybrid coupler 105.

Figure 25:
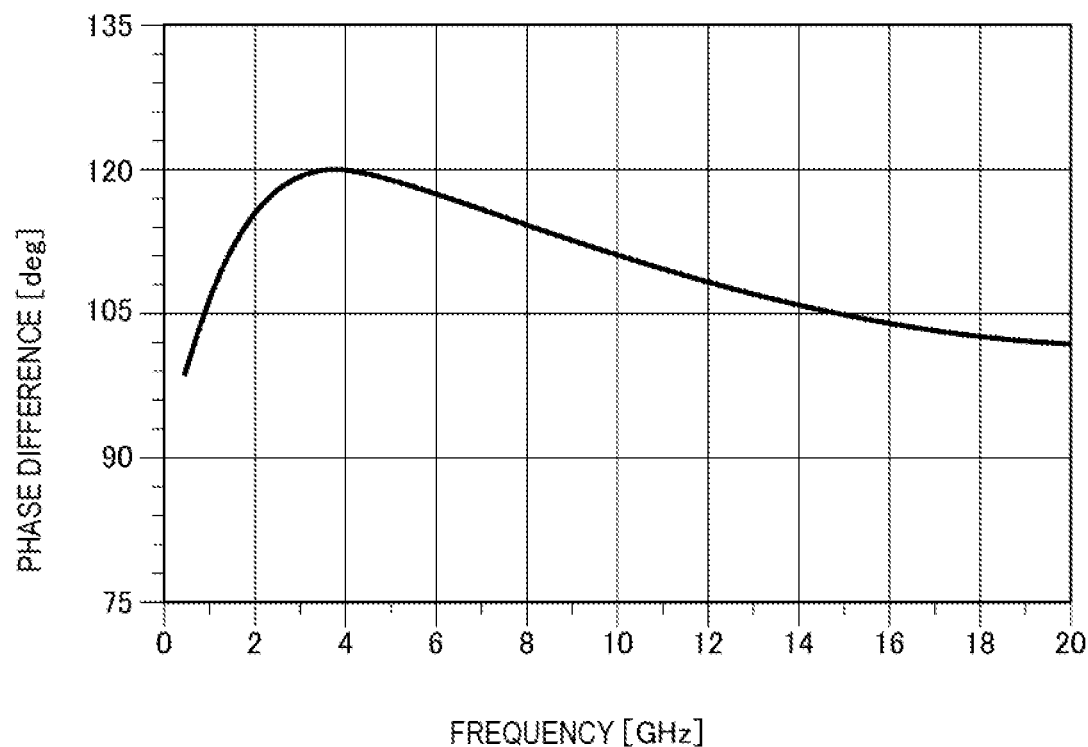
FIG. 25 is a diagram illustrating a simulation result of the phase difference in a power amplifier according to the reference example of the second embodiment.

The reference example corresponding to FIG. 20 is the graph, in FIG. 25, illustrating the phase difference calculated similarly by using a power amplifier which does not include the hybrid coupler 105. Also, in FIG. 25, the phase difference is approximately 120°, and the output is substantially in phase.

Figure 21:
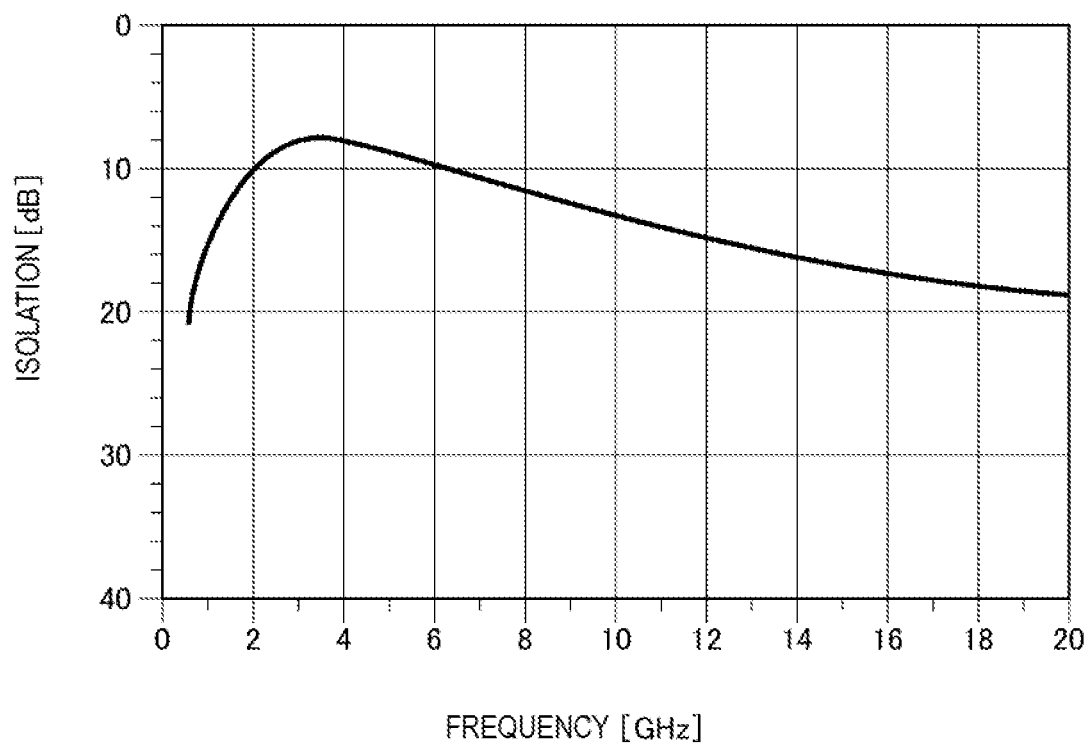
FIG. 21 is a diagram illustrating a simulation result of isolation in a power amplifier according to the second embodiment.

FIG. 21 is a graph illustrating the isolation of signal RF4 which is input to the transmission line 1051, in the power amplifier 1800. That is, FIG. 21 is a graph illustrating the degree of leakage of signal RF4 to the transmission line 1052. In FIG. 21, the isolation is −7.910 dB at a frequency of 3.75 GHz.

Figure 26:
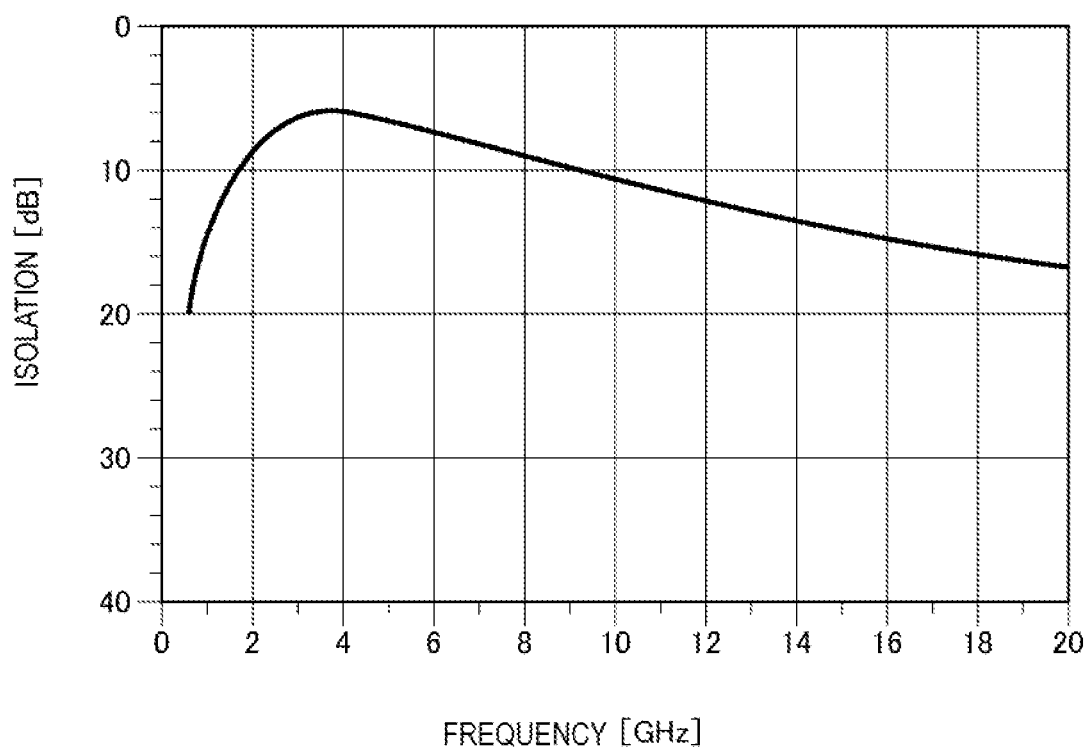
FIG. 26 is a diagram illustrating a simulation result of isolation in a power amplifier according to the reference example of the second embodiment.

The reference example corresponding to FIG. 21 is the graph about the isolation in FIG. 26. In FIG. 26, the isolation changes as in FIG. 21.

Figure 22:
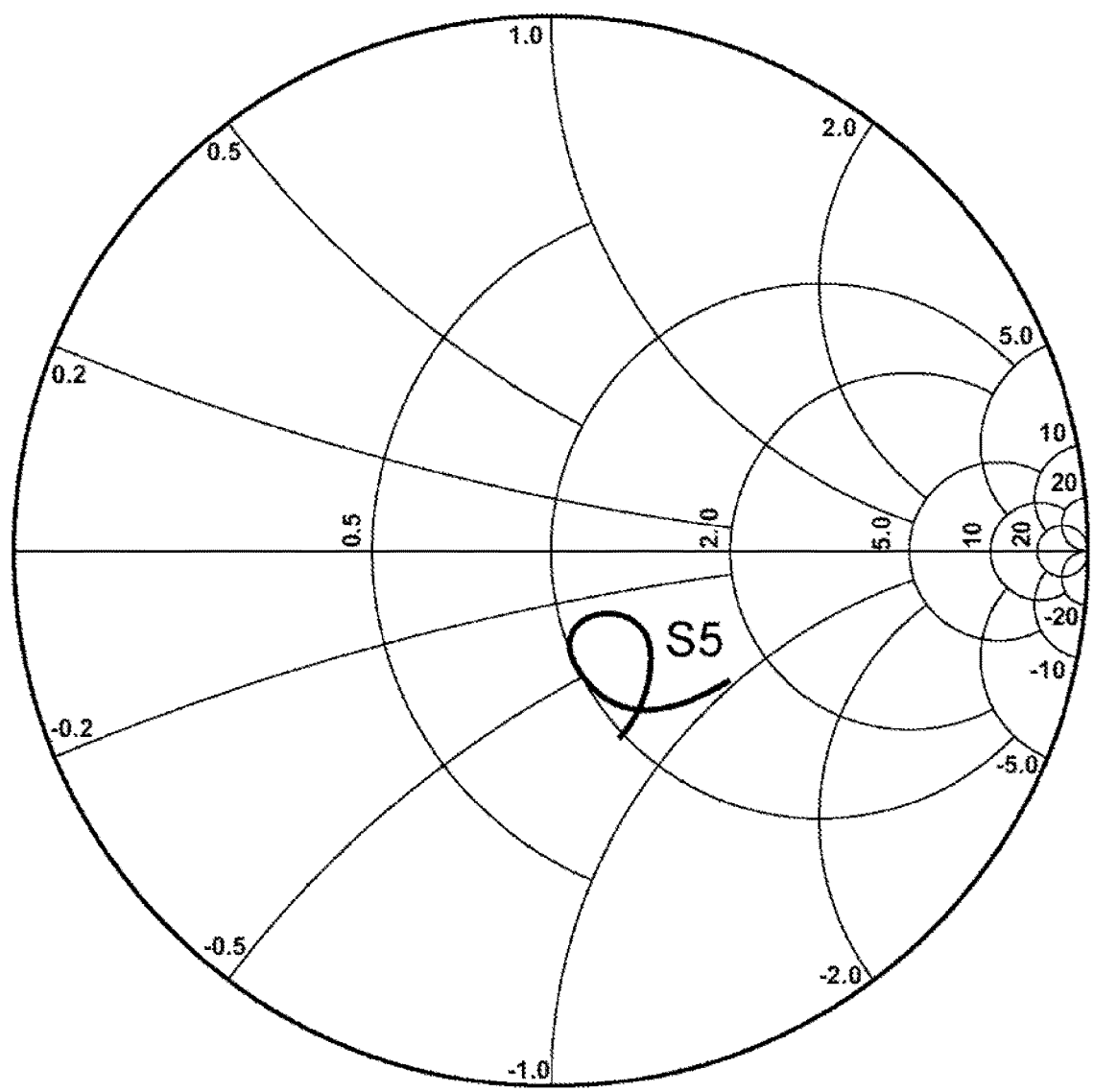
FIG. 22 is a diagram illustrating a locus of the impedance on the load side, as seen from the output port of a carrier amplifier, in a peak operation according to the second embodiment.
Figure 23:
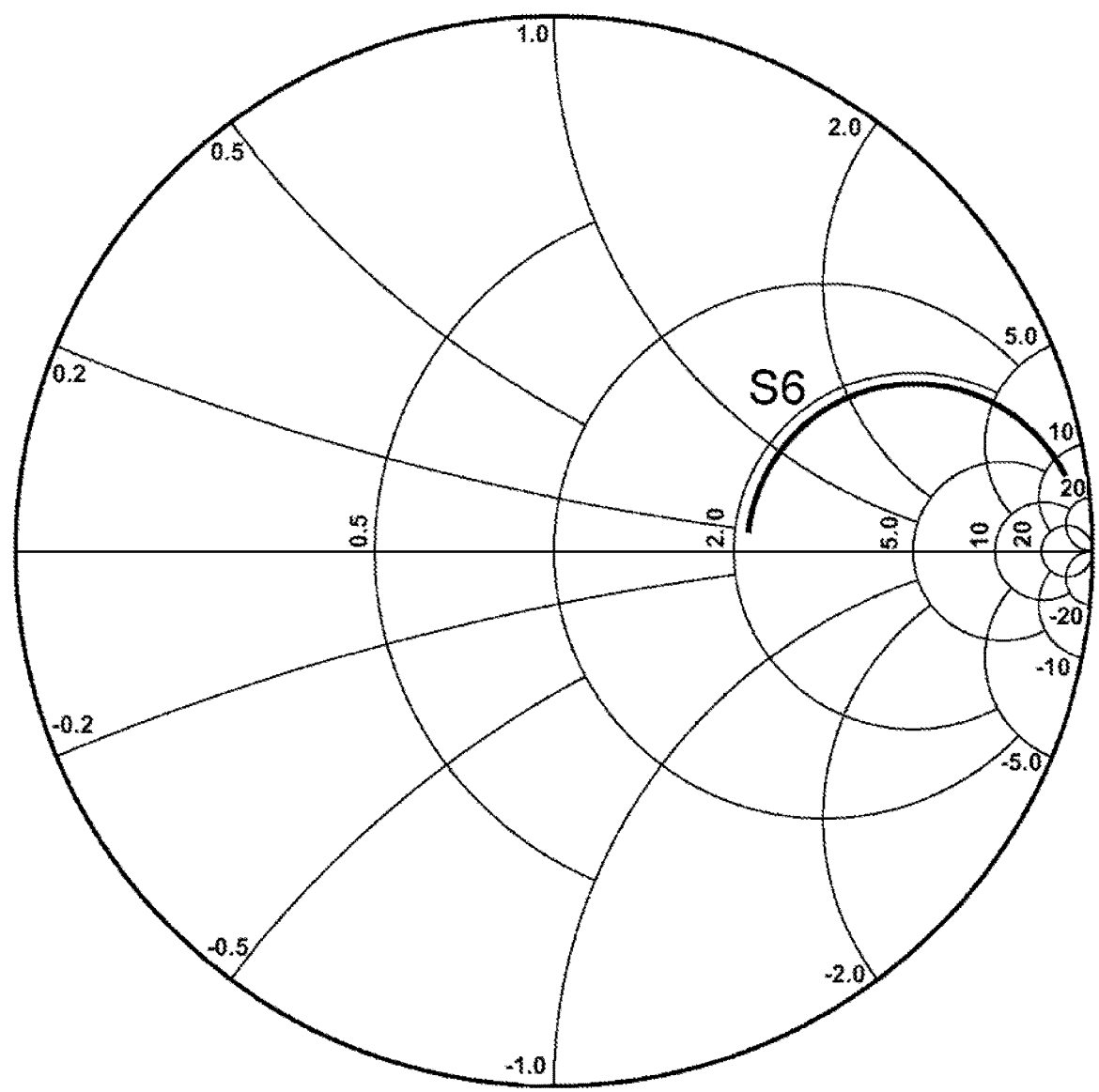
FIG. 23 is a diagram illustrating a locus of the impedance on the load side, as seen from the output port of a carrier amplifier, in a backoff operation according to the second embodiment.

FIG. 22 is a Smith chart for describing the impedance as seen from the carrier amplifier 103 toward the output side in the case where the power amplifier 1800 performs a peak operation. FIG. 23 is a Smith chart for describing the impedance as seen from the carrier amplifier 103 toward the output side in the case where the power amplifier 1800 performs a backoff operation. Curve S5 in FIG. 22 and curve S6 in FIG. 23 indicate loci obtained when the frequency changes from 500 MHz to 20 GHz.

Figure 27:
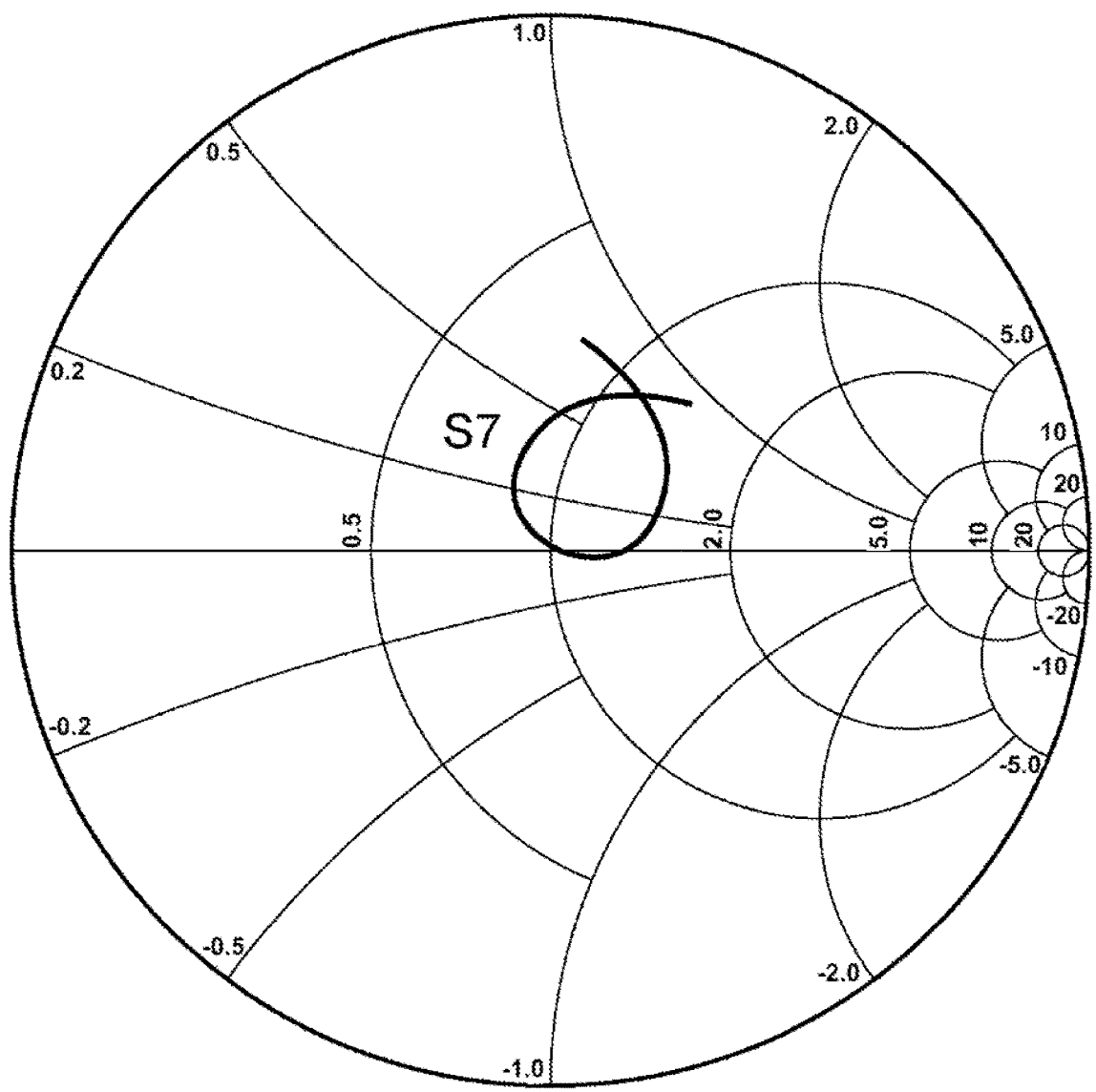
FIG. 27 is a diagram illustrating a locus of the impedance on the load side, as seen from the output port of a carrier amplifier, in a peak operation of a power amplifier according to the reference example of the second embodiment.
Figure 28:
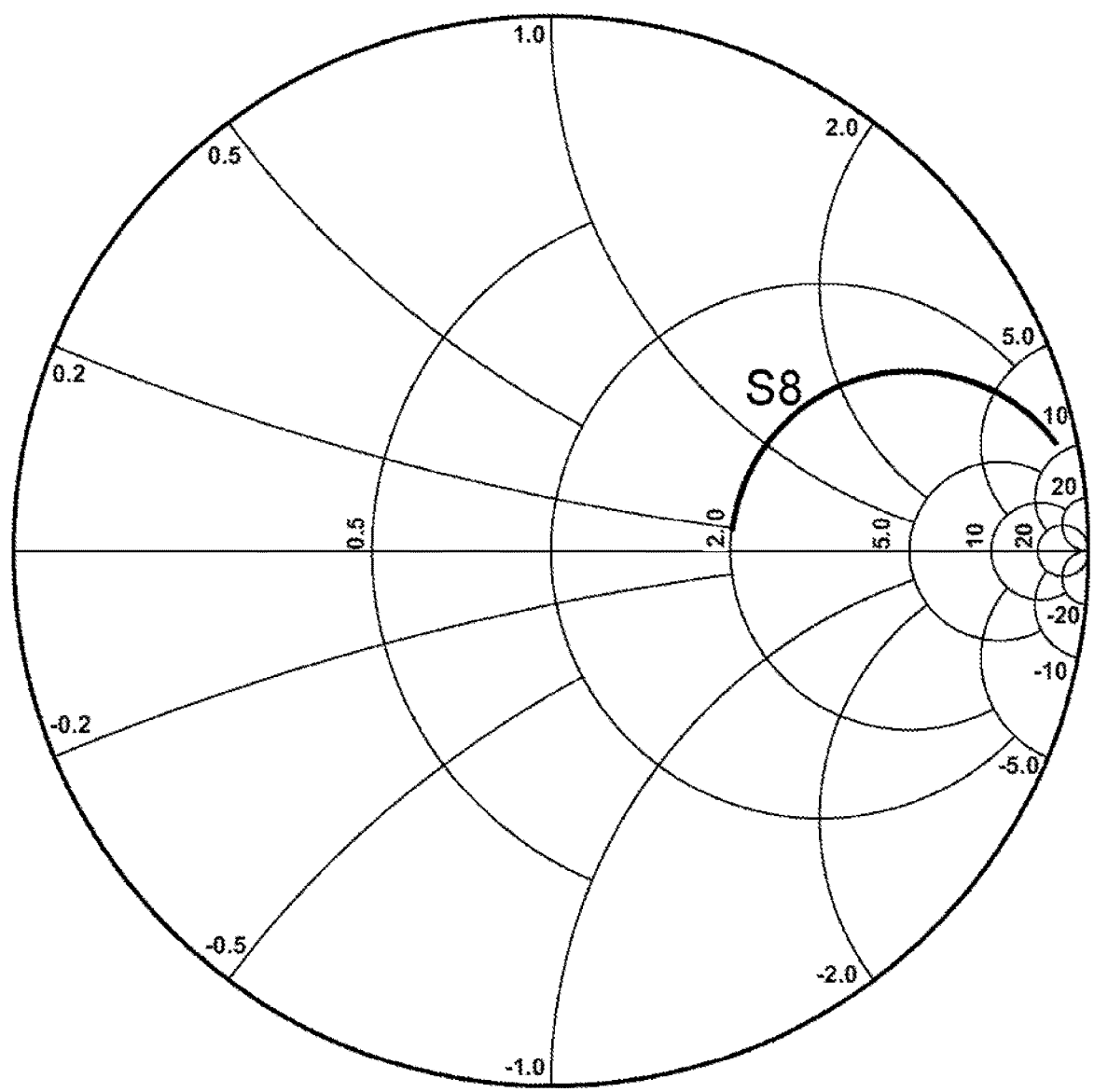
FIG. 28 is a diagram illustrating a locus of the impedance on the load side, as seen from the output port of a carrier amplifier, in a backoff operation of a power amplifier according to the reference example of the second embodiment.

The reference example corresponding to FIG. 22 is FIG. 27, and the reference example corresponding to FIG. 23 is FIG. 28. FIG. 27 is a Smith chart for describing the impedance obtained in a peak operation. FIG. 28 is a Smith chart for describing the impedance obtained in a backoff operation. Curve S7 in FIG. 27 and curve S8 in FIG. 28 are loci obtained when the frequency changes from 500 MHz to 20 GHz.

It is shown that, in the Smith charts in FIG. 27 and FIG. 28, the loci change as in the Smith charts in FIG. 22 and FIG. 23.

FIGS. 19 to 23 and FIGS. 24 to 28 indicate that the power amplifier 1800 operates like a power amplifier which functions as a Doherty amplifier. Therefore, the power amplifier 1800 functions as a Doherty amplifier.

Figure 29:
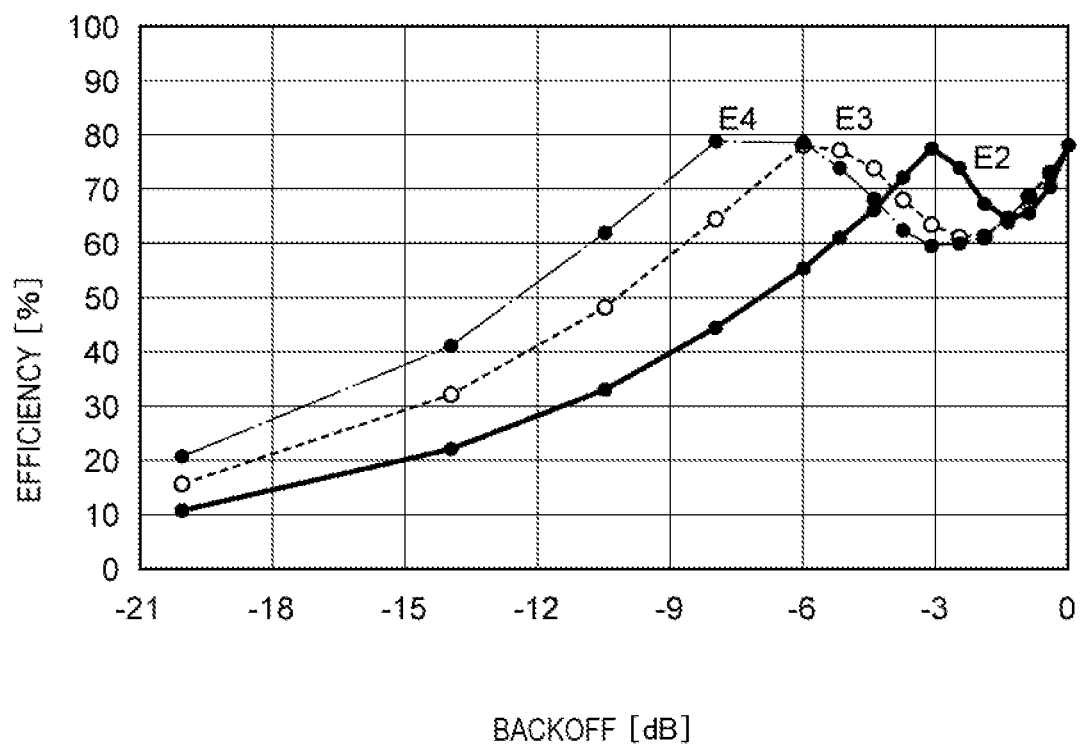
FIG. 29 is a diagram for describing an example of the efficiency of a power amplifier according to the second embodiment.

FIG. 29 illustrates the efficiency obtained in the power amplifier 1800 in the case where θ takes multiple values and where the horizontal axis represents the decibel value relative to the peak power of an input signal, that is, the backoff value. Curve E2 indicates the case in which 2θ=90°; curve E3 indicates the case in which 2θ=109°; curve E4 indicates the case in which 2θ=120°. The power amplifier 1800 performs a peak operation when the backoff amount is equal to or greater than 3 dB. This causes a backoff amount to be provided even when the peak-to-average power ratio (PAPR) is large, enabling the power amplifier 1800 to function as a Doherty amplifier which maintains high efficiency.

Exemplary embodiment of the present disclosure is described above. The power amplifier 100 includes the 3-dB coupler 102, the carrier amplifier 103, the peak amplifier 104, and the hybrid coupler 105. The 3-dB coupler 102 splits signal RF1 into signal RF2 and signal RF3 that lags behind signal RF2 by about 90°. The carrier amplifier 103 amplifies signal RF2 in a range in which the power level of signal RF1 is equal to or higher than the first level, and outputs signal RF4. The peak amplifier 104 amplifies signal RF3 in a range in which the power level of signal RF1 is equal to or higher than the second level that is higher than the first level, and outputs signal RF5. The hybrid coupler 105 includes the transmission line 1051 and the transmission line 1052. The transmission line 1051 receives signal RF4 at its first terminal. The transmission line 1052 receives signal RF5 at its first terminal. The transmission line 1052 is open at its second terminal. The transmission line 1051 outputs, from its second terminal, an amplified signal of signal RF1 obtained by combining signal RF4 with signal RF5.

Thus, the power amplifier 100 functions as a power amplifier which amplifies signal RF1 with high efficiency with the on state of the peak amplifier 104 being switched in accordance with the power level of an amplified signal. The power amplifier 100, which combines power by using the hybrid coupler 105, enables influence from the parasitic component to be reduced compared with a Doherty amplifier which includes an inductor device.

In the power amplifier 100, the hybrid coupler 105 may include the dielectric 1001 between the transmission line 1051 and the transmission line 1052.

This enables the capacitance value between the lines to be made higher than the case in which the dielectric 1001 is not present and in which there is a free space. When the transmission line 1051 and the transmission line 1052 are regarded as a single capacitance device, the area, which is required to obtain a certain capacitance value, of the facing surfaces of the transmission lines may be made small. If the thickness of a transmission line is constant, the length of the transmission lines may be made short, enabling a reduction in the size of the hybrid coupler 105 to be achieved.

The hybrid coupler 105, the carrier amplifier 103, and the peak amplifier 104 may be disposed on the same substrate. This enables the circuit to be made further smaller while influence from the parasitic component in wiring for connecting the circuit device is reduced.

The power amplifier 1800 according to the second embodiment includes the splitter 1801, the carrier amplifier 103, the peak amplifier 104, and the hybrid coupler 105. The splitter 1801 splits signal RF1 into signal RF2 and signal RF3 which lags behind signal RF2. The carrier amplifier 103 amplifies signal RF2 in a range in which the power level of signal RF1 is equal to or higher than the first level, and outputs signal RF4. The peak amplifier 104 amplifies signal RF3 in a range in which the power level of signal RF1 is equal to or higher than the second level which is higher than the first level, and outputs signal RF5. The hybrid coupler 105 includes the transmission line 1051 and the transmission line 1052. The transmission line 1051 receives signal RF4 at its first terminal. The transmission line 1052 receives signal RF5 at its first terminal. The transmission line 1052 is open at its second terminal. The transmission line 1051 outputs, from its second terminal, an amplified signal of signal RF1 which is obtained by combining signal RF4 with signal RF5.

This enables the phase lag of signal RF3 to be set appropriately by using the splitter 1801. If the phase lag is greater than about 90°, the backoff amount is 3 dB or greater. This enables the power amplifier 1800 to function as a power amplifier which reduces influence from the parasitic component, and which, at the same time, amplifies signal RF1 with high efficiency even if signal RF1 has a high PAPR.

In the power amplifier 1800, signal RF3 may lag behind signal RF2 by about 120°. This causes the backoff amount to be 6 dB, and the power amplifier 1800 may amplify signal RF1 with high efficiency even if signal RF1 has a high PAPR.

The embodiments described above are provided for ease of understanding of the prevent disclosure, not for limited interpretation of the present disclosure. The present disclosure may be changed/improved without necessarily departing from the gist of the present disclosure, and encompasses its equivalence. That is, embodiments, which are obtained by those skilled in the art changing the design of the embodiments appropriately and which have the characteristics of the present disclosure, are encompassed in the scope of the present disclosure. For example, the components and their positions, the material, the condition, the shape, the size, and the like which are included in the embodiments are not limited to those illustrated, and may be changed appropriately. Needless to say, the embodiments are exemplary, and partial replacement or combination of the configurations illustrated in different embodiments may be made. Such embodiments, which have the characteristics of the present disclosure, are encompassed in the scope of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier comprising: a splitter configured to split a first signal into a second signal and a third signal, the third signal being delayed from the second signal by 90°; a first amplifier configured to amplify the second signal and to output a fourth signal when a power level of the first signal is equal to or greater than a first level; a second amplifier configured to amplify the third signal and to output a fifth signal when the power level of the first signal is equal to or greater than a second level, the second level being greater than the first level; and a hybrid coupler comprising a first transmission line and a second transmission line, wherein the first transmission line is configured to receive the fourth signal at a first terminal of the first transmission line, wherein the second transmission line is configured to receive the fifth signal at a first terminal of the second transmission line, wherein the second transmission line is open at a second terminal of the second transmission line, wherein the first transmission line is configured to output, from a second terminal of the first transmission line, an amplified first signal, the amplified first signal being a combination of the fourth signal and the fifth signal, and wherein the second transmission line is open at the second terminal of the second transmission line and the second transmission line is connected to a passive device whose impedance is greater than or equal to a hundred-fold of a characteristic impedance of the second transmission line.

\* \* \* \* \*